US012699146B2

(12) United States Patent
Barsukov et al.

(10) Patent No.: US 12,699,146 B2
(45) Date of Patent: Aug. 4, 2026

(54) BATTERY IMPEDANCE SPECTRA MEASUREMENT

(71) Applicant: Texas Instruments Incorporated, Dallas, TX (US)

(72) Inventors: Yevgen Pavlovich Barsukov, Richardson, TX (US); David Patrick Magee, Allen, TX (US); Charles Kasimer Sestok, IV, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 18/182,306

(22) Filed: Mar. 10, 2023

(65) Prior Publication Data

US 2023/0204679 A1 Jun. 29, 2023

Related U.S. Application Data

(63) Continuation of application No. 17/520,319, filed on Nov. 5, 2021, now Pat. No. 11,604,228.

(60) Provisional application No. 63/118,394, filed on Nov. 25, 2020.

(51) Int. Cl.
| | |
|---|---|
| *G01R 31/389* | (2019.01) |
| *G01R 31/367* | (2019.01) |
| *G01R 31/3842* | (2019.01) |
| *G01R 31/396* | (2019.01) |

(52) U.S. Cl.
CPC ......... *G01R 31/389* (2019.01); *G01R 31/367* (2019.01); *G01R 31/3842* (2019.01); *G01R 31/396* (2019.01)

(58) Field of Classification Search
None
See application file for complete search history.

(56) References Cited

U.S. PATENT DOCUMENTS

| | | | |
|---|---|---|---|
| 6,502,046 B1 | 12/2002 | Yoon et al. | |
| 11,604,228 B2 * | 3/2023 | Barsukov ............. | G01R 31/367 |
| 2021/0223327 A1 * | 7/2021 | Berger ................ | G01R 31/396 |

* cited by examiner

*Primary Examiner* — Jas A Sanghera
(74) *Attorney, Agent, or Firm* — Zhenhai Fu; Frank D. Cimino

(57) ABSTRACT

From a current measurement circuit, digital samples are received of a current signal that flows through a battery cell within a measurement period. From a voltage measurement circuit, digital samples are received of a voltage signal across the battery cell within the measurement period. First voltage spectral components are generated based on performing a first transform operation on the digital samples of the voltage signal. A current spectrum is generated based on performing a second transform operation on the digital samples of the current signal. Second voltage spectral components are generated based on a first condition of the battery cell before the measurement period and a second condition of the battery cell after the measurement period. A voltage spectrum is including the first voltage spectrum and the second voltage spectrum is generated. An impedance spectrum of the battery cell is generated based on the voltage spectrum and the current spectrum.

41 Claims, 20 Drawing Sheets

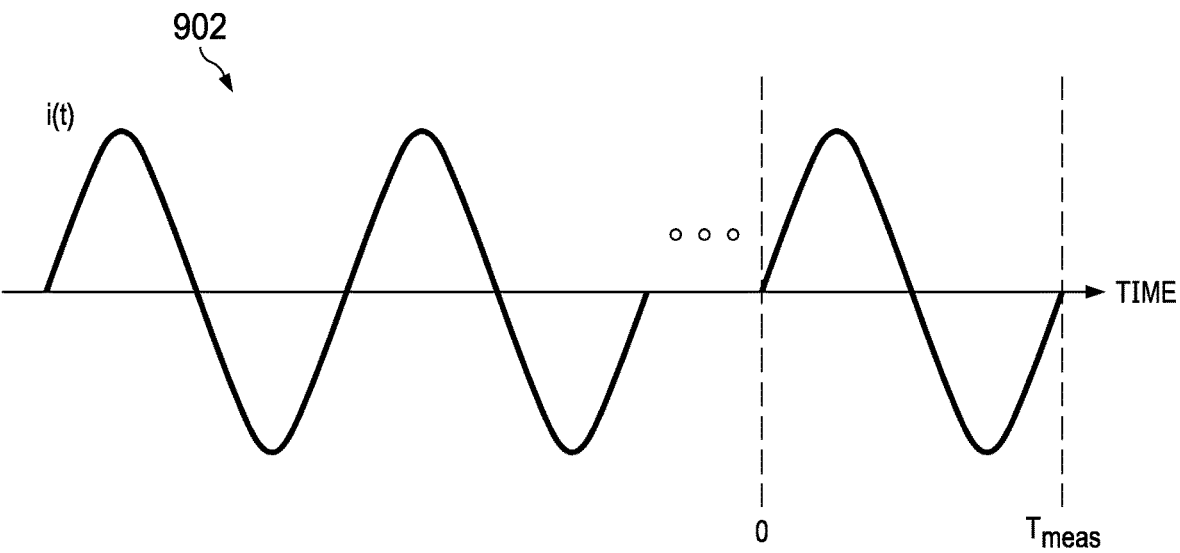
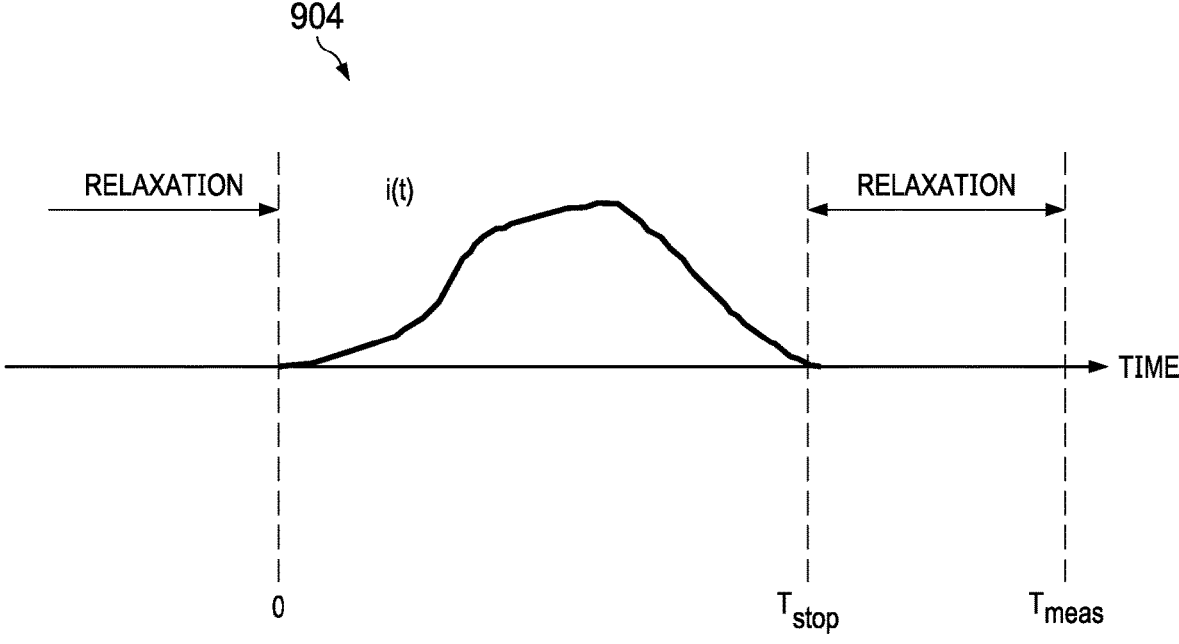
FIG. 9

1000

| DEGREE OF DISCHARGE (DOD) | TEMPERATURE | | | | | |
|---|---|---|---|---|---|---|
| | Temp_0 | Temp_1 | Temp_2 | ○ ○ ○ | Temp_A |
| DOD_0 | $\{R, C\}_{0,0}$ | $\{R, C\}_{0,1}$ | $\{R, C\}_{0,2}$ | ○ ○ ○ | $\{R, C\}_{0,A}$ |
| DOD_1 | $\{R, C\}_{1,0}$ | $\{R, C\}_{1,1}$ | $\{R, C\}_{1,2}$ | ○ ○ ○ | $\{R, C\}_{1,A}$ |
| DOD_2 | $\{R, C\}_{2,0}$ | $\{R, C\}_{2,1}$ | $\{R, C\}_{2,2}$ | ○ ○ ○ | $\{R, C\}_{2,A}$ |
| ○ ○ ○ | ○ ○ ○ | ○ ○ ○ | ○ ○ ○ | ○ ○ ○ | ○ ○ ○ |
| DOD_B | $\{R, C\}_{B,0}$ | $\{R, C\}_{B,1}$ | $\{R, C\}_{B,2}$ | ○ ○ ○ | $\{R, C\}_{B,A}$ |

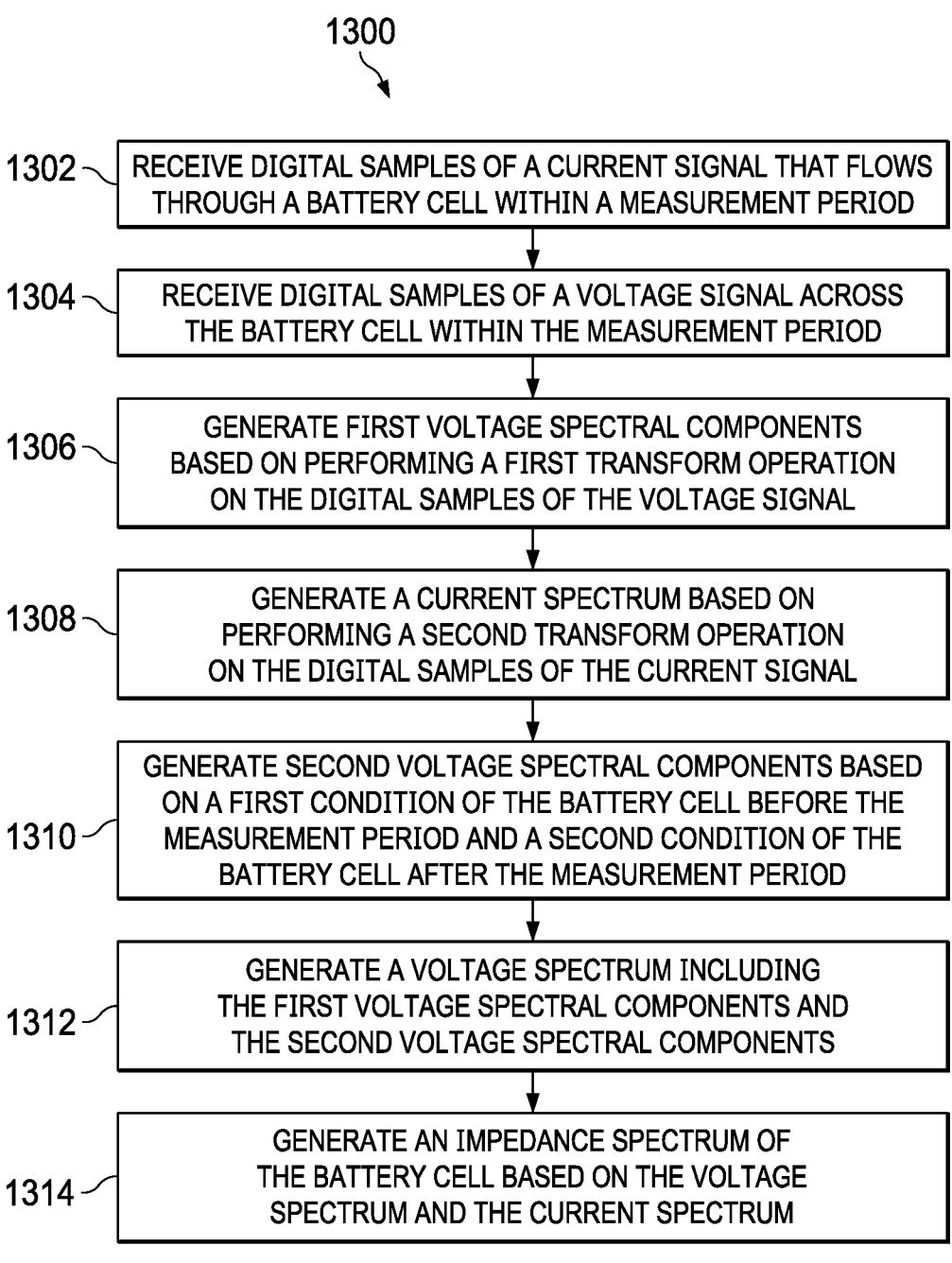

1302 — RECEIVE DIGITAL SAMPLES OF A CURRENT SIGNAL THAT FLOWS THROUGH A BATTERY CELL WITHIN A MEASUREMENT PERIOD

1304 — RECEIVE DIGITAL SAMPLES OF A VOLTAGE SIGNAL ACROSS THE BATTERY CELL WITHIN THE MEASUREMENT PERIOD

1306 — GENERATE FIRST VOLTAGE SPECTRAL COMPONENTS BASED ON PERFORMING A FIRST TRANSFORM OPERATION ON THE DIGITAL SAMPLES OF THE VOLTAGE SIGNAL

1308 — GENERATE A CURRENT SPECTRUM BASED ON PERFORMING A SECOND TRANSFORM OPERATION ON THE DIGITAL SAMPLES OF THE CURRENT SIGNAL

1310 — GENERATE SECOND VOLTAGE SPECTRAL COMPONENTS BASED ON A FIRST CONDITION OF THE BATTERY CELL BEFORE THE MEASUREMENT PERIOD AND A SECOND CONDITION OF THE BATTERY CELL AFTER THE MEASUREMENT PERIOD

1312 — GENERATE A VOLTAGE SPECTRUM INCLUDING THE FIRST VOLTAGE SPECTRAL COMPONENTS AND THE SECOND VOLTAGE SPECTRAL COMPONENTS

1314 — GENERATE AN IMPEDANCE SPECTRUM OF THE BATTERY CELL BASED ON THE VOLTAGE SPECTRUM AND THE CURRENT SPECTRUM

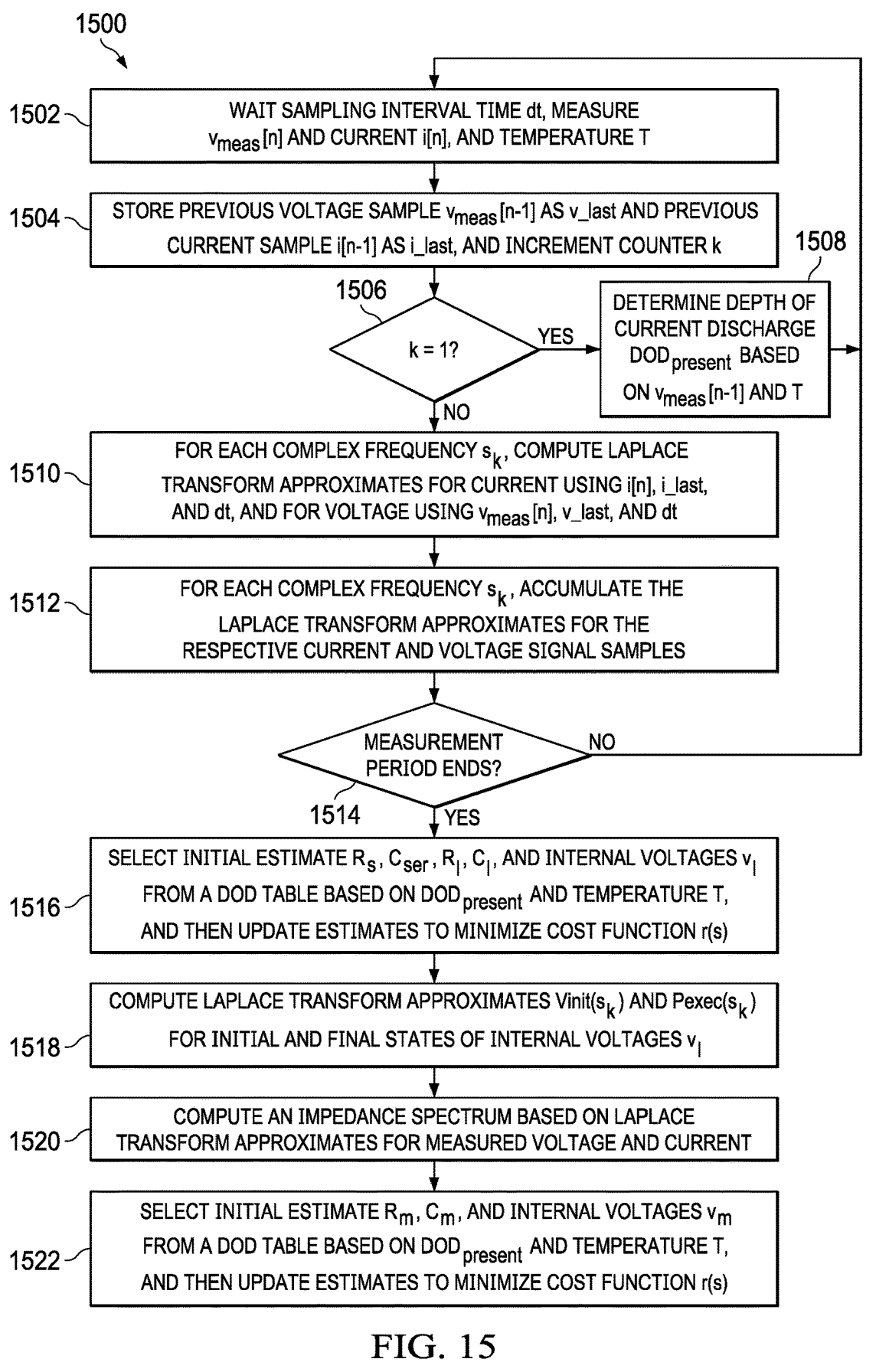

1502 — WAIT SAMPLING INTERVAL TIME dt, MEASURE $v_{meas}[n]$ AND CURRENT i[n], AND TEMPERATURE T

1504 — STORE PREVIOUS VOLTAGE SAMPLE $v_{meas}[n-1]$ AS v_last AND PREVIOUS CURRENT SAMPLE i[n-1] AS i_last, AND INCREMENT COUNTER k

1506 k = 1?

1508 — YES → DETERMINE DEPTH OF CURRENT DISCHARGE $DOD_{present}$ BASED ON $v_{meas}[n-1]$ AND T

NO

1510 — FOR EACH COMPLEX FREQUENCY $s_k$, COMPUTE LAPLACE TRANSFORM APPROXIMATES FOR CURRENT USING i[n], i_last, AND dt, AND FOR VOLTAGE USING $v_{meas}[n]$, v_last, AND dt

1512 — FOR EACH COMPLEX FREQUENCY $s_k$, ACCUMULATE THE LAPLACE TRANSFORM APPROXIMATES FOR THE RESPECTIVE CURRENT AND VOLTAGE SIGNAL SAMPLES

MEASUREMENT PERIOD ENDS? — NO

1514

YES

1516 — SELECT INITIAL ESTIMATE $R_s$, $C_{ser}$, $R_l$, $C_l$, AND INTERNAL VOLTAGES $v_l$ FROM A DOD TABLE BASED ON $DOD_{present}$ AND TEMPERATURE T, AND THEN UPDATE ESTIMATES TO MINIMIZE COST FUNCTION r(s)

1518 — COMPUTE LAPLACE TRANSFORM APPROXIMATES $Vinit(s_k)$ AND $Pexec(s_k)$ FOR INITIAL AND FINAL STATES OF INTERNAL VOLTAGES $v_l$

1520 — COMPUTE AN IMPEDANCE SPECTRUM BASED ON LAPLACE TRANSFORM APPROXIMATES FOR MEASURED VOLTAGE AND CURRENT

1522 — SELECT INITIAL ESTIMATE $R_m$, $C_m$, AND INTERNAL VOLTAGES $v_m$ FROM A DOD TABLE BASED ON $DOD_{present}$ AND TEMPERATURE T, AND THEN UPDATE ESTIMATES TO MINIMIZE COST FUNCTION r(s)

FIG. 15

BATTERY IMPEDANCE SPECTRA MEASUREMENT

CROSS-REFERENCE TO RELATED APPLICATION

This application is a continuation of U.S. patent application Ser. No. 17/520,316 filed Nov. 5, 2021, which claims priority to U.S. Provisional Patent Application No. 63/118,394 filed Nov. 25, 2020, which is incorporated by reference herein.

BACKGROUND

Battery impedance measurement applies impedance spectroscopy techniques to characterize the frequency-dependent impedance of a battery cell in a battery. A battery cell has an anode (a negative terminal) and a cathode (a positive terminal) separated by an electrolyte that produces a voltage and a current. For manufacturing convenience, a battery can contain one or more battery packs. Each battery pack can contain one or more battery cells coupled together in series and/or in parallel. Battery cell impedance spectra measurements are useful in various application areas to provide non-destructive electrochemical characterization of the battery. The battery cell impedance spectra measurement results can provide information useful to improve operations of a battery pack during charge, discharge, cell balancing, and/or cell disconnect conditions. The battery cell impedance spectra measurement results can also provide information useful to diagnose possible issues of the battery, which can facilitate maintenance and/or replacement of one or battery packs in the battery.

SUMMARY

An apparatus includes a voltage measurement circuit, a current measurement circuit, and a controller circuit. The voltage measurement circuit has first measurement inputs and a first measurement output. The first measurement inputs are adapted to be coupled across a battery cell. The current measurement circuit has second measurement inputs and a second measurement output. The second measurement inputs are adapted to be coupled to the battery cell. The controller circuit has control inputs and control outputs. The control inputs are coupled to the first measurement output and the second measurement output. The controller circuit is configured to receive, via the control inputs, digital samples of a current signal that flows through the battery cell within a measurement period. The controller circuit is also configured to receive, via the control inputs, digital samples of a voltage signal across the battery cell within the measurement period. The controller circuit is further configured to generate first voltage spectral components based on performing a first transform operation on the digital samples of the voltage signal. The controller circuit is configured to generate a current spectrum based on performing a second transform operation on the digital samples of the current signal. The controller circuit is configured to generate second voltage spectral components based on a first condition of the battery cell before the measurement period and a second condition of the battery cell after the measurement period. The controller circuit is further configured to generate a voltage spectrum including the first voltage spectral components and the second voltage spectral components. The controller circuit is configured to provide, via the control outputs, an impedance spectrum of the battery cell based on the voltage spectrum and the current spectrum.

In a method, digital samples of a current signal that flows through a battery cell within a measurement period are receive from a current measurement circuit. Digital samples of a voltage signal across the battery cell within the measurement period are received from a voltage measurement circuit. First voltage spectral components are generated by a controller circuit based on performing a first transform operation on the digital samples of the voltage signal. A current spectrum is generated by the controller circuit based on performing a second transform operation on the digital samples of the current signal. Second voltage spectral components are generated by the controller circuit based on a first condition of the battery cell before the measurement period and a second condition of the battery cell after the measurement period. A voltage spectrum including the first voltage spectrum and the second voltage spectrum is generated by the controller circuit. An impedance spectrum of the battery cell is generated by the controller circuit based on the voltage spectrum and the current spectrum.

BRIEF DESCRIPTION OF THE DRAWINGS

FIG. 9 illustrates example operation conditions in which a battery cell has matching initial and final conditions.

FIG. 10 is an example data table to support battery cell spectra measurements in operation conditions where the initial and final conditions of the battery mismatch, in accordance with various examples.

FIGS. 13A, 13B, 14 and 15 are flowcharts of example operations of performing battery cell spectra measurements using example techniques of FIGS. 5A through 11, in accordance with various examples.

DETAILED DESCRIPTION

Figure 1A:
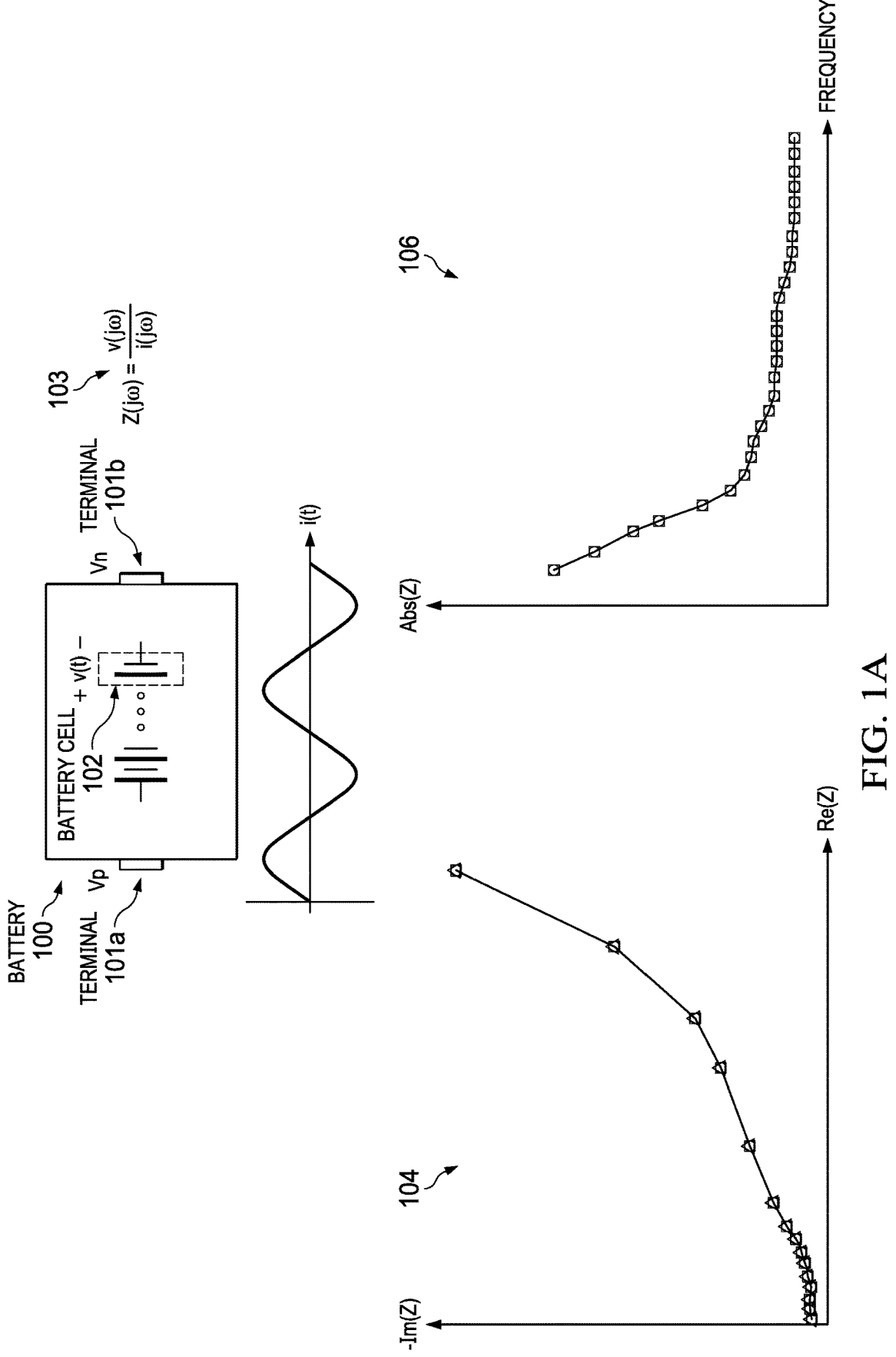
FIG. 1A and FIG. 1B illustrate examples of characteristics of a battery cell that can be measured using techniques of example embodiments.

FIG. 1A illustrates an example of impedance characteristics of a battery 100. Battery 100 can include a battery pack having a plurality of battery cells coupled in series and/or in parallel between terminals 101a and 101b. Terminal 101a can be a positive terminal and have a voltage Vp, and terminal 101b can be a negative terminal and have a voltage Vn. An example battery cell 102 of battery 100 is also shown in FIG. 1A. In a case where battery 100 comprises electrochemical cells, battery cell 102 can have a frequency-dependent impedance Z. The frequency dependence of the impedance can be attributed to the underlying chemical processes of the electrochemical cell. As a current i(t) flows through battery cell 102, a voltage v(t) can develop across the impedance Z in response to the current. In some examples, the voltage v(t) can be applied across the impedance Z, and the current i(t) can flow in response to the voltage. In frequency domain, impedance Z can be characterized by a ratio between the spectral representations of voltage v(t) and current i(t), shown as V(jω) and I(jω) in expression 103 of FIG. 1A where w is the angular frequency in units of rad/sec and j is the unit imaginary number. V(jω) can be a voltage spectrum including a first set of spectral components at a set of angular frequencies, and I(jω) can be a current spectrum including a second set of spectral components at the set of angular frequencies.

In embodiments described herein: (a) a battery cell impedance spectra measurement is performed in a time efficient manner, so the result of the measurement could account for dynamic operation conditions of the battery; and (b) the battery cell impedance spectra measurement operation is performed when the battery is supplying power to a load, so it can support various applications, such as real-time monitoring of a battery in an automobile during a driving operation.

An impedance spectrum is useful to update an internal resistance of a battery cell used to compute optimal charging current that is as high as possible but will not cause Li-plating. Also, single frequency impedance measurement is useful to determine the core temperature of a battery cell more accurately as compared to external battery pack case temperature measurement using a thermistor, especially for fast charging where the temperature difference between cell core and case can be large, sometimes up to 20° C. Further, impedance spectra measurement can be performed as a function of depth of discharge (DOD). DOD may refer to a fraction or a percentage of the capacity which has been removed from the fully charged battery. The DODs of battery cells within a battery pack can be used to predict, for example, usable state of charge (SOC) and state of health (SOH) of the battery cells, and can be used in a cell rebalancing operation. For example, battery cells having a high DOD can be decoupled from the load, while battery cells having a low DOD can be coupled to the load to supply power, until all battery cells have the same DOD.

Also, the battery cell impedance spectra measurement results can also provide information useful to diagnose possible issues in the battery, which can facilitate maintenance and/or replacement of the battery or a given battery pack. For example, the impedance spectrum of a battery cell can be correlated with different failure conditions, such as internal short, deviation from linear increase of impedance to hockey-stick increase which can indicate an upcoming complete failure, etc., and battery cell having these issues can be replaced. Moreover, charging of the battery can also be disabled based on detection of soft internal short from impedance measurement of the battery during discharge or rest, which can prevent charging from a soft short to a hard short and the associated safety hazard.

To obtain an impedance spectrum of a battery cell, a current signal through the battery cell and a voltage signal across the battery cell can each be sampled and measured to obtain, respectively, a time-series of current values and a time-series of voltage values. Transform operations, such as discrete Fourier transform (DFT), can be performed to transform the current values and voltage values from a time domain to a frequency domain, and spectral representations of the current values and of the voltage values can be obtained. The impedance spectrum can then be generated as a ratio between the spectral representation of the current values and the spectral representation of the voltage values. For reasons described below, some limitations make DFT unsuitable for battery cell impedance spectra measurement in a wide range of operation conditions. Example techniques are proposed to address such issues and to improve the accuracy of battery cell impedance spectra measurement.

In some examples, the impedance Z of battery cell 102 can be frequency-dependent, so it has an impedance spectrum. The spectral components of the impedance Z can be complex and have a real component (resistance) and an imaginary component (reactance), and both the resistance and reactance can vary with frequency. The impedance spectrum can be represented in various forms. Graph 104 on the left side of FIG. 1A illustrates an example of the impedance spectrum Z represented by a mapping between imaginary and real components of the impedance spectrum at different frequencies. Graph 106 on the right side of FIG. 1A illustrates another example of the impedance spectrum represented by a mapping between the magnitudes of the impedance spectral components and frequency.

Figure 1B:
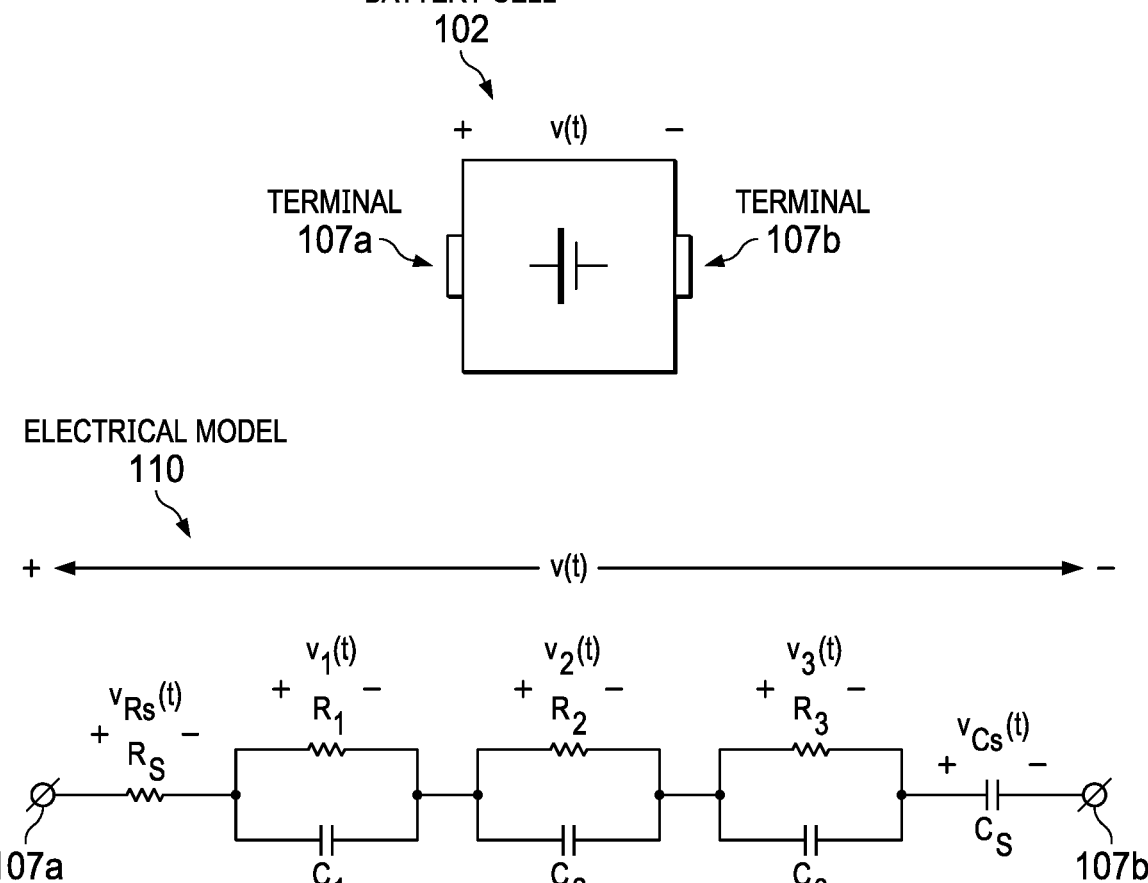

FIG. 1B illustrates an example electrical model 110 of battery cell 102 that can provide an analytical model for the frequency-dependent impedance Z. Impedance Z can be measured across terminals 107a and 107b of battery cell 102. Electrical model 110 can include multiple model components coupled in series between terminals 107a and 107b of battery cell 102. In some examples, the model components can include a series resistor $R_S$, one or more parallel resistor-capacitor networks (e.g., resistor $R_1$ and capacitor $C_1$, resistor $R_2$ and capacitor $C_2$, resistor $R_3$ and capacitor $C_3$, etc.), and a series capacitor $C_S$. Although FIG. 1B illustrates that electrical model 110 has three parallel resistor-capacitor networks, electrical model 110 can include any number of parallel resistor-capacitor networks in other examples. The parallel resistor-capacitor networks can model the electrochemical process of the battery cell when being charged or discharged, the series resistor $R_S$ can model terminal resistances, series capacitor $C_S$ can model a state of stored charge of the battery cell. With a current i(t) flowing across each model component, a voltage can develop across the model component based on the component's impedance, which can be purely resistive for resistor $R_S$, purely reactive for series capacitor $C_S$, and both resistive and reactive for resistor-capacitor networks $R_1$ and $C_1$, $R_2$ and $C_2$, and $R_3$ and $C_3$. The total voltage response across battery cell 102, $v_r(t)$, equals a sum of internal voltages across each of the model components, including $v_{RS}(t)$ across series resistor $R_S$, $v_1(t)$ for resistor-capacitor network $R_1$ and $C_1$, $v_2(t)$ for resistor-capacitor network $R_2$ and $C_2$, $v_3(t)$ for resistor-capacitor network $R_3$ and $C_3$, and $v_{CS}(t)$ across series capacitor $C_S$. The $v_{CS}(t)$ across series capacitor $C_S$ is also known as open circuit voltage (OCV). The combined impedances of the model components, as well as voltage $v_r(t)$, can change with the frequency of current i(t), hence giving rise to the frequency-dependent impedance Z of battery 100. The resistance and capacitor values in electrical model 110 typically vary based on the operation conditions of battery cell 102, such as temperature, depth of discharge (DOD) and age of the battery cell, such that frequency-dependent impedance Z of battery cell 102 can also vary according to the operation conditions.

The impedance spectrum of battery cell 102, which can be in the forms illustrated in graphs 104 and 106 of FIG. 1A, can be obtained by a battery cell impedance spectra measurement operation. The impedance spectrum of a battery cell can provide information useful to improve operations of a battery pack during charge, discharge, cell balancing, and/or cell disconnect conditions, as well as information useful to diagnose possible issues of the battery cell, which can facilitate maintenance and/or replacement of the battery pack or the entire battery.

Figure 2A:
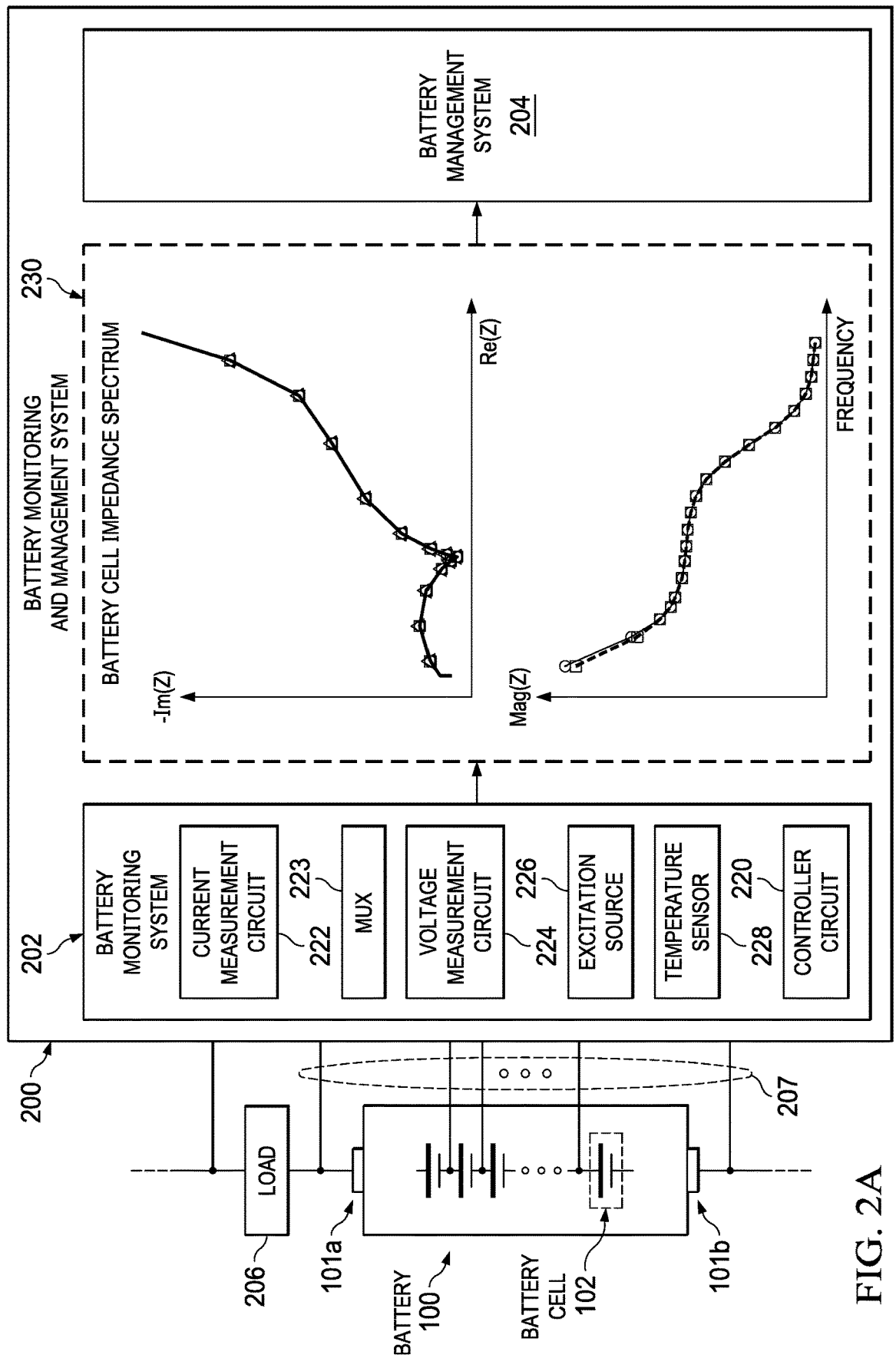
FIGS. 2A through 2C illustrate examples of a battery monitoring system for a battery and its applications, in accordance with various examples.
Figures 2B, 2C:
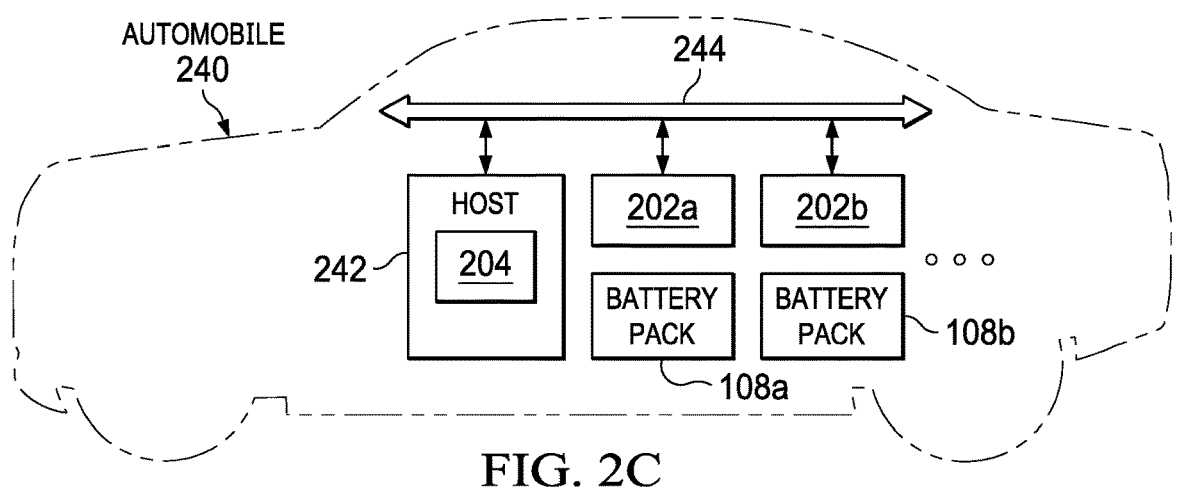

FIGS. 2A through 2C illustrate examples of a battery monitoring and management system 200 that can perform a battery cell impedance spectra measurement operation and a management operation on battery 100. As shown in FIG. 2A, a battery monitoring and management system 100 can include a battery monitoring system 202 and a battery management system 204. Battery monitoring and management system 200 can be coupled across a load 206 and battery 100 that supplies power to load 206. As described above, battery 100 may be in the form of a battery pack and can include a plurality of battery cells coupled in series and/or in parallel. Each battery cell can include an electrochemical cell, and battery 100 can have a frequency-dependent impedance.

Battery monitoring system 202 can include a controller circuit 220, a current measurement circuit 222, a voltage measurement circuit 224, and an excitation source 226. In some examples, battery monitoring system 202 can also include a multiplexor circuit 223. Battery monitoring system 202 can have pairs of electrical connections 227 to the positive and negative terminals of each battery cell of battery 100. In some examples, battery monitoring system 202 may also include a temperature sensor 228. Controller circuit 220 can include, for example, a general-purpose central processing unit (CPU), a digital signal processor, a microcontroller, an application specific integrated circuit (ASIC), etc., and can include a memory. Controller circuit 220 can execute instructions from the memory to perform an impedance characterization operation for battery 100, and store and fetch the results of the characterization operation from the memory. Controller circuit 220 can also control the operations of current measurement circuit 122, voltage measurement circuit 224, excitation source 226, and temperature sensor 228 to perform the impedance characterization operation.

Battery monitoring system 202 (and controller circuit 220) can perform the impedance characterization operation based on various techniques. For example, the impedance characterization operation can include a galvanostatic measurement, in which a current signal is supplied to charge or discharge battery 100. For example, excitation source 226 can supply an external current, and load 206 can supply an internal current. Voltage measurement circuit 224 can measure a voltage response signal across each battery cell 102 as a result of the flow of the current signal. As another example, the impedance characterization operation can include a potentiostatic measurement, in which excitation source 226 can apply a voltage signal across battery 100, and current measurement circuit 222 can measure a current signal that flows through battery 100 (as a charging current or a discharging current) as a result of the application of the voltage signal. In both cases, current measurement circuit 222 and voltage measurement circuit 224 can sample and measure the respective current signal and voltage signal to obtain, respectively, a time-series of current values and a time-series of voltage values. Controller circuit 220 can perform transform operations on the current values and voltage values from a time domain to a frequency domain to generate the respective current spectrum and voltage spectrum. Controller circuit 220 can generate battery cell impedance spectrum 230 for a battery cell of battery 100 as a ratio between the current spectrum and the voltage spectrum of the battery cell.

In some examples, battery monitoring system 202 can sample and measure the load current that flows through load 206 and supplied by battery 100 and generate the current spectrum, if the load current includes sufficient spectral information within a range of frequencies of interest. But if the load current does not include sufficient spectral information, battery monitoring system 202 can control excitation source 226 to supply battery 100 and/or remove an external excitation from battery 100. The external excitation can be in the form of voltage or current and can have the requisite spectral characteristics within the frequency range of interest. In some examples, excitation source 226 may include a pulse width modulation (PWM) controller to generate one or more current pulses, and the current pulses can be configured to approximate a periodic function, such as a sinusoidal function, to generate a periodic current signal having pre-determined spectral characteristics.

Specifically, controller circuit 220 can control current measurement circuit 222 to measure a current signal that flows through battery 100, and generate samples of the current signal. Controller circuit 220 can measure the current based on, for example, measuring a voltage across a resistive part of load 206 through which the current signal flows, measuring a voltage across a current path through which excitation source 226 supplies battery 100 and/or removes from battery 100 the external excitation current/voltage. In some examples, controller circuit 220 can control multiplexor circuit 223 to select a pair of electrical connections 207 coupled across a particular battery cell of battery 100 (e.g., battery cell 102), and connect the selected pair of electrical connections 207 to control voltage measurement circuit 224 to measure a voltage signal across the particular battery cell in response to the flow of the current signal, and generate samples of voltage signal. Controller circuit 220 can control multiplexor circuit 223 to select different pairs of electrical connections 207 sequentially to measure the voltage signal across different battery cells. In some examples, controller circuit 220 can include multiple sets of voltage measurement circuits 224, with each voltage measurement circuit 224 adapted to measure the voltage signal across a respective battery cell simultaneously, and multiplexor circuit 223 can be optional accordingly.

Each of current measurement circuit 222 and voltage measurement circuit 224 can include pre-processing circuits, such as analog/digital filters, amplifiers, etc., to perform various pre-processing operations on the voltage/current signals. The pre-processing operations can include filtering operation to remove high frequency spectral components that can cause aliasing in the downstream sampling operation, amplification/attenuation operations, etc. Each of current measurement circuit 222 and voltage measurement circuit 224 can also include an analog-to-digital converter (ADC) to sample the pre-processed analog signal (e.g., a voltage across a battery cell 102, or a voltage across a resistive path to measure the current), and digitalize the signal sample. The sampling rate/frequency can be based on the Nyquist frequency, which can be twice of the maximum frequency of interest. For example, if the maximum frequency of interest is 10 kHz, the sampling frequency can be at least 20 kHz. The digital samples of the voltage signal and current signal can be stored in the memory and fetched by controller circuit 220 to compute battery cell impedance spectrum 230.

FIG. 2B illustrates examples of internal components of current measurement circuit 222, voltage measurement circuit 224, and excitation source 226. In FIG. 2B, MUX 223 is controlled by controller circuit 220 to select a pair of electrical connections 207 across battery cell 102 of battery 100, and route the selected pair of electrical connections 207 to voltage measurement circuit 224. As shown in FIG. 2B, current measurement circuit 222 can include filters 222$a$ and 222$b$, operational amplifiers 222$c$ and 222$d$, and ADCs 222$e$ and 222$f$. Filter 222$a$ can perform a filtering operation on a voltage signal across load 206, which can be used to measure a current signal that flows out of battery 100 (and battery cell 102) and through load 206. The filtered voltage signal can be amplified by operational amplifier 222$c$, and the amplified voltage signal can be sampled and digitized by ADC 222$e$ to generate digital samples of a current signal that flows through load 206. Moreover, filter 222$b$ can perform a filtering operation on a voltage signal across a resistor 226$a$ along a current path of a discharge current signal provided by excitation source 226. The filtered voltage across resistor 226$a$ can be amplified by operational amplifier 222$d$, and the amplified voltage signal can be sampled and digitized by ADC 222$f$ to generate digital samples of the discharge current signal.

In addition, voltage measurement circuit 224 can include a subtractor circuit 224$a$, a filter 224$b$, an operational amplifier 224$c$, an ADC 224$d$, and a digital-to-analog converter (DAC) 224$e$. Voltage measurement circuit 224 can receive a voltage signal across battery cell 102 (or other battery cell of battery 100) from MUX 223, and subtractor circuit 224$a$ can subtract, from the voltage signal, a DC bias voltage provided by DAC 224$e$. With such arrangements, the range of voltages to be digitized by ADC 224$b$ can be reduced, which can also reduce the voltage range represented by each bit of ADC 224$b$. This arrangement can also reduce quantization error and improve the measurement accuracy of voltage measurement circuit 224. In some examples, subtraction circuit 224$a$ can include a voltage subtraction circuit implemented by an operational amplifier, an AC capacitor, etc. The voltage signal with DC bias removed can be filtered by filter 224$b$ and amplified by amplifier 224$c$, and the amplified voltage signal can be sampled and digitized by ADC 222$f$ to generate digital samples of the voltage signal.

In some examples, excitation source 226 can include a switchable current path coupled between the positive and negative terminals of battery 100. The switchable current path can include resistor 226$a$, and a switch 226$b$ controlled by a pulse width modulation (PWM) controller 226$c$. Switch 226$b$ can include a transistor, such as an N-type field effect transistor (NFET), a P-type field effect transistor (PFET), or a parallel combination of both. The current path can be enabled by PWM controller 226$c$ closing switch 226$b$ to provide an electrical short between the positive and negative terminals of battery 100 to discharge the battery, which causes a discharge current signal to flow through resistor 226$a$, and the discharge current signal can be sampled and measured by ADC 222$f$ as described above. PWM controller 226$c$ control a duty cycle of a PWM signal to control the magnitude and frequency of the discharge current signal. In some examples, excitation source 226 can also include a current source 226$d$ coupled between a voltage source (not shown in the figures) and positive terminal 101$a$ of battery 100 to supply a charging current. The voltage source can provide a higher voltage than the voltage of battery 100 at positive terminal Vp, which allows the charging current to flow into the positive terminal to charge battery 100.

Referring back to FIG. 2A, controller circuit 220 can perform computations to transform the digital samples of current signal and voltage signal from the time domain to, respectively, spectral representations of the current samples and of the voltage samples. Each spectral representation can include a set of spectral components over a set of frequencies. In some examples, controller circuit 220 can obtain a temperature measurement of battery 100 from temperature sensor 228, and include the temperature measurement in the computation of the spectral representations. Controller circuit 220 can generate a battery cell impedance spectrum 230 based on determining, for each frequency in the set of frequencies, a ratio between a voltage spectral component and a current spectral component each at that frequency. Battery cell impedance spectrum 230 can be in various forms, such as a mapping between imaginary and real components of the impedance spectrum at different frequencies, a mapping between the magnitude and phase of the impedance spectral components and frequency, etc., as shown in FIG. 1A.

Battery management system 204 can perform a management operation of battery cell 102, and of other battery cells of battery 100, based on battery cell impedance spectrum 230. The management can be directed to, for example, charging, discharging, cell balancing, and/or cell disconnect operations. For example, based on battery cell impedance spectrum 230, battery management system 204 can determine an internal resistance of a battery cell, and then compute an optimal charging current that is as high as possible but will not cause Li-plating of battery cell 102. As another example, battery monitoring system 202 can perform a single frequency impedance measurement by applying a single-frequency excitation signal (e.g., a current, a voltage, etc.) to battery 100, and then measuring the voltage and/or current of battery cell 102. From the single frequency impedance measurement, battery management system 204 can determine the core temperature of battery cell 102. Such a measurement can be more accurate as compared to, for example, external casing temperature measurement using a thermistor, especially for fast charging where the temperature gradient between cell core and casing can be high.

In addition, from battery cell impedance spectrum 230 of each battery cell of battery 100, battery management system 204 can determine the depth of discharge (DOD) of each battery cell, predict usable state of charge (SOC) and state of health (SOH) of the battery cells based on their DODs, and perform a cell rebalancing operation. For example, battery management system 204 can decouple battery cells of battery 100 having high DODs from load 206, and couple battery cells having low DODs with load 206, until all battery cells have the same DOD.

Further, battery management system 204 can diagnose possible issues of battery 100 based on battery cell impedance spectrum 230 of each battery cell, and output indications to facilitate maintenance and/or replacement of battery 100. For example, impedance spectrum 230 of battery cell 102 can be correlated with different failure conditions, such as internal short, deviation from linear increase of impedance to hockey-stick increase which can indicate an upcoming complete failure, etc. Based on detecting some or all of these potential issues from impedance spectrum 230, battery management system 204 can output an indication that battery cell 102 should be replaced. In some examples, battery management system 204 can also detect a potential soft internal short in battery cell 102 during discharge or rest from impedance spectrum 230, and stop the charging of battery cell 102 to prevent charging from a soft short to a hard short and the associated safety hazard.

In some examples, battery monitoring and management system 200 can be implemented in an automobile to monitor and manage the battery packs in the automobile. Battery monitoring system 202 and battery management system 204 can also be implemented as a distributed system. FIG. 2C illustrates an example application of battery monitoring and management system 200 in an automobile 240. As shown in FIG. 2B, battery management system 204 can be implemented in a host device 242, and battery monitoring system 202 can be embedded with different battery packs. For example, battery monitoring system 202a can be embedded with battery pack 108a and to perform impedance spectra measurement for battery cells in battery pack 108a, whereas battery monitoring system 202b can be embedded with battery pack 108b and to perform impedance spectra measurement for battery cells in battery pack 108b. Each of battery monitoring system 202a and 202b is coupled with host device 242 (and battery management system 204) via a network 244, which can be a Controller Area Network (CAN bus). Battery monitoring systems 202a and 202b can perform the battery cell impedance spectra measurement operations and transmit the impedance spectrum data back to battery management system 204 via network 244 on a regular basis, or upon receiving requests from battery management system 204.

Figure 3:
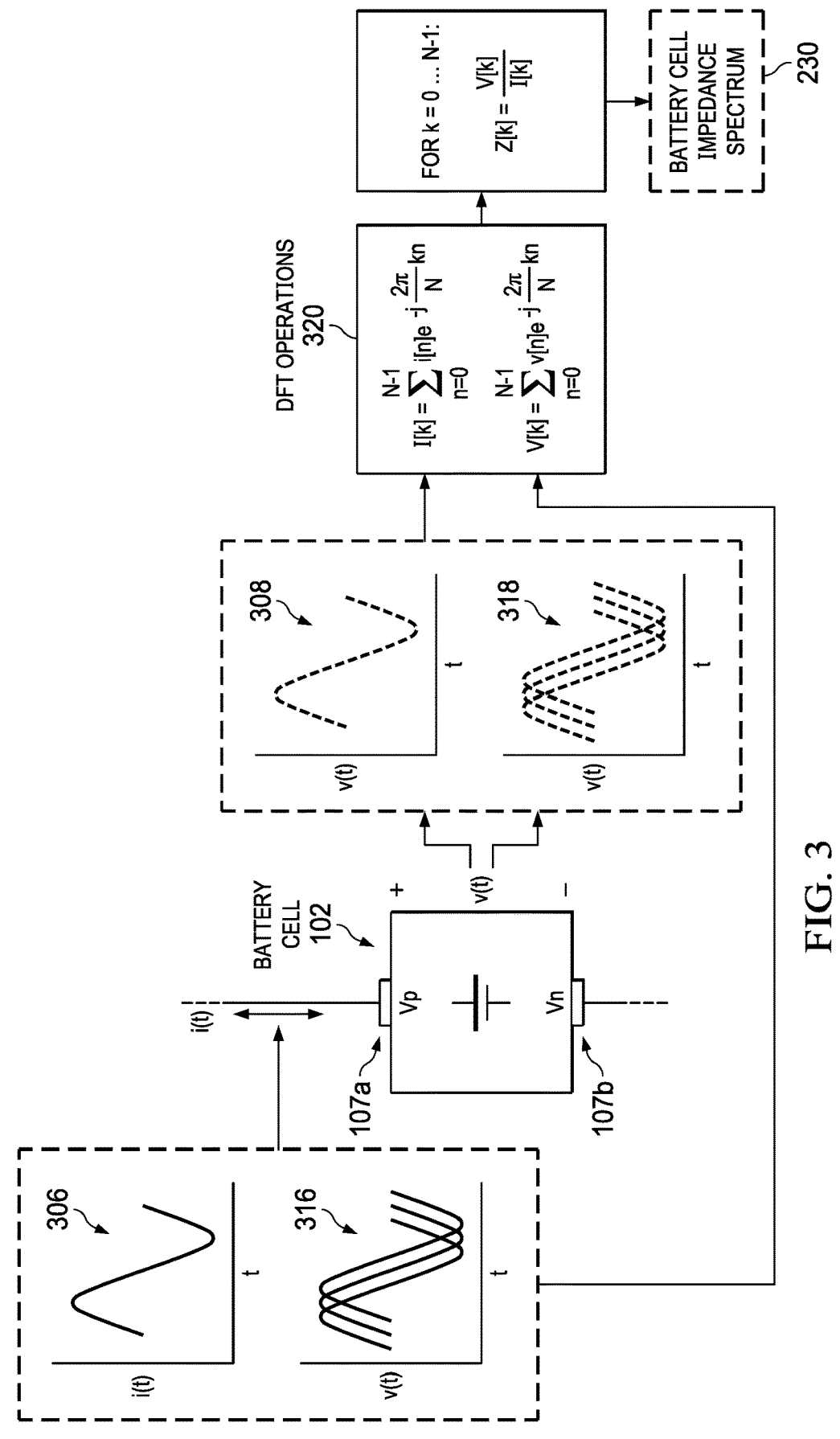
FIG. 3 illustrates a data flow diagram of example battery cell spectra measurement operations, in accordance with various examples.

FIG. 3 illustrates a data flow diagram of an example battery cell impedance spectra measurement-operation that can be performed by battery monitoring system 202. Referring to FIG. 3, battery monitoring system 202 can inject a periodic sinusoidal excitation current signal i(t) into battery 100 (e.g., using current source 226d) to generate a voltage signal v(t) across battery cell 102. In some examples, current signal i(t) can include a sinusoidal current signal 306 having a single frequency, and battery cell 102 can generate a voltage signal 308 at that frequency in response to current signal 306. In some examples, current signal i(t) can include a multi-sinusoidal current signal 316 having multiple time-overlapping sinusoidal signals, each with a different frequency. In response to current signal 316, battery cell 102 can generate a voltage signal 318 having the same set of multiple frequencies as current signal 316.

Battery monitoring system 202 can control current measurement circuit 222 and voltage measurement circuit 224 to obtain samples of the respective current signal and voltage response signal within a measurement window. Controller circuit 220 can perform discrete Fourier transform (DFT) operations 320 on the current and voltage response signals samples to compute current and voltage response spectral components. Controller circuit 220 can perform DFT operations 320 using any suitable algorithms, such as fast Fourier transform (FFT) algorithms. DFT operations 320 can be performed on the current and voltage response signals samples to compute current and voltage response spectral components according to the following equations:

$$I[k] = \sum_{n=0}^{N-1} i[n] e^{-j\frac{2\pi}{N}kn} \qquad \text{(Equation 1)}$$

-continued $$V[k] = \sum_{n=0}^{N-1} v[n] e^{-j\frac{2\pi}{N}kn} \qquad \text{(Equation 2)}$$

In Equations 1 and 2, i[n] and v[n] represents an n-th current/voltage signal sample obtained by, for example, current measurement circuit 222 and voltage measurement circuit 224 within the measurement window, I[k] and V[k] represent, respectively, a k-th current spectral component and a k-th voltage spectral component. N represents the total number of signal samples within the measurement window, and j represents the unit imaginary number. Different k indices can be mapped to different frequencies based on a sampling frequency of the current and voltage response signals.

Controller circuit 220 can determine the impedance spectral components Z[k] based on a ratio between V[k] and I[k] for k=0 to N−1, to generate an impedance spectrum (e.g., impedance spectrum 230) for a set of frequencies mapped to the different k indices, as follows:

$$Z[k] = \frac{V[k]}{I[k]} \text{ for } k = 0 \text{ to } N-1 \qquad \text{(Equation 3)}$$

While controller circuit 220 can perform DFT operations 320 to generate an impedance spectrum, various limitations make DFT operations challenging for a battery cell impedance spectra measurement in certain operation conditions, such as in an automobile. First, controller circuit 220 may perform the DFT operations on samples of current and voltage signals obtained from battery cell 102 after battery cell 102 has reached steady state (e.g., having a constant state of charge (SOC)). Accordingly, various electrical model parameters of battery cell 102 that can affect the impedance Z can stay constant. Moreover, the DFT operation may require that the excitation current signal and the resulting voltage signal are periodic, and the initial and final conditions of the signals (e.g., signals correspond to n=0 and n=N−1 in Equations 1 and 2) match. The voltage/current signal output by battery cell 102 responsive to a periodic excitation signal (current/voltage signal) can having matching initial and final conditions if battery cell 102 has reached steady state.

While battery monitoring system 202 can perform an off-line impedance measurement (e.g., when battery 100 is not operational and not supplying power to load 206) when battery cell 102 reaches the steady state, it may be challenging for battery monitoring system 202 to perform real-time monitoring of battery 100 when battery 100 is operational, such as in a driving or charging operation of automobile 240, if battery monitoring system 202 were to wait till battery cell 102 reaches the steady state to perform the impedance measurement. Specifically, the state of charge of battery 100 can vary during the operation of the automobile, and it may take a long time for battery 100 to reach the steady state, especially in a case where the excitation signal includes multiple cycles of sinusoidal current/voltage signals of different periods to cover all frequencies of interest. This may also cause battery monitoring system 202 to wait for a long period of time before collecting voltage and current signal samples. But such a long period of time may be not feasible for a real-time monitoring operation, especially if the monitoring operation is to account for rapid and unexpected changes in the operation conditions of the battery.

Moreover, applying a periodic excitation signal to charge battery 100 while battery 100 is operational, in order to obtain periodic current/voltage signals from battery 100, can waste power and pose a safety risk. Specifically, as described above, excitation source 226 may include a voltage source operating at a higher positive voltage than battery 100 coupled to current source 226d to charge the battery. The voltage source can be a high voltage external power supply, but such a power supply can use additional power and is power inefficient, especially if the additional power is not used in other operations of the automobile. Moreover, it can also be unsafe to charge battery 100 when the battery is in operation. Overvoltage and overcurrent protection mechanisms can be introduced to improve safety, but these mechanisms can increase the overall complexity of the excitation source. The complexity of the excitation source, as well as the associated energy inefficiency and safety risk, can be further increased when the battery includes multiple battery cells stacked in series to output a high voltage, which may need to be matched or exceeded by the external power source of the excitation source in order to charge battery 100.

In addition, applying a periodic excitation signal to charge battery 100 does not necessarily produce periodic current/voltage signals in battery 100. Specifically, battery 100 may be coupled with an arbitrary and variable current load during driving or the regenerative charging of the battery. Even if a periodic excitation voltage/current signal is supplied to battery 100, the variable current load can introduce distortions to the periodic voltage signal across battery, and the voltage signal across battery 100 can become aperiodic. There can also be mismatches between the first and last samples of the current and voltage response signals collected in the measurement window.

Performing a DFT operation on voltage and current signals obtained from a battery when the battery is not in steady state, or on the aperiodic voltage signal and current signal samples having mismatching initial and final conditions, can introduce spectral elements that either do not belong to the signal being processed or do not reflect the actual electrical properties of the battery, both of which can lead to substantial errors in the resulting impedance spectrum.

Figure 4A:
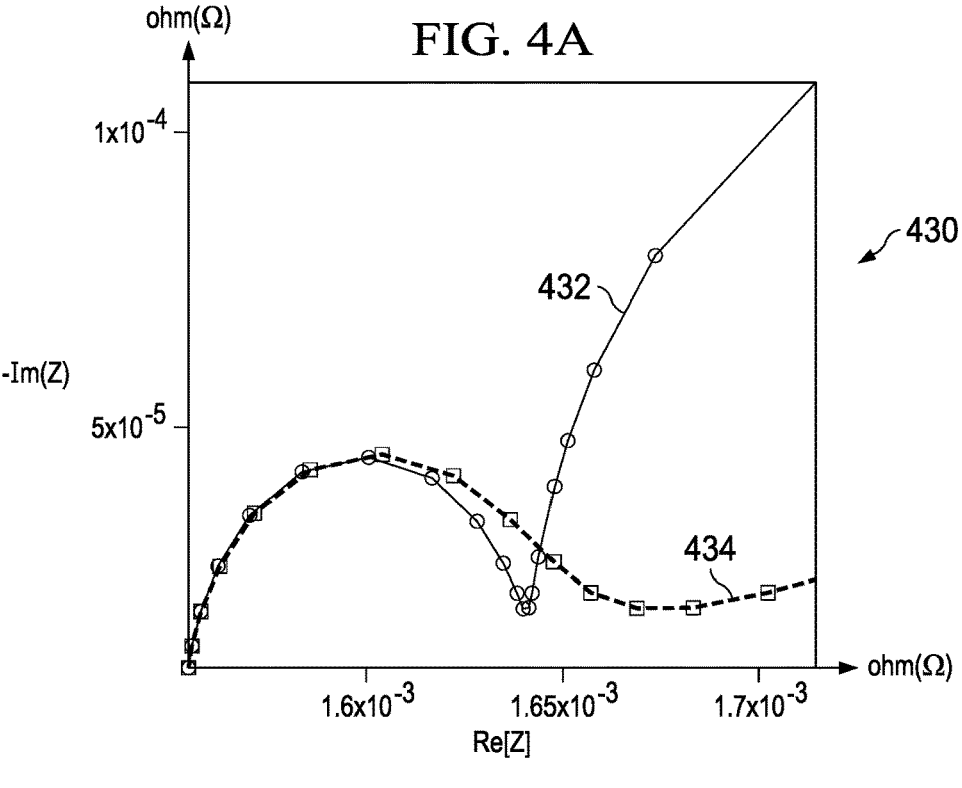
FIGS. 4A through 4C are a set of graphs of example battery cell spectra measurement results using the techniques of FIG. 3.
Figure 4B:
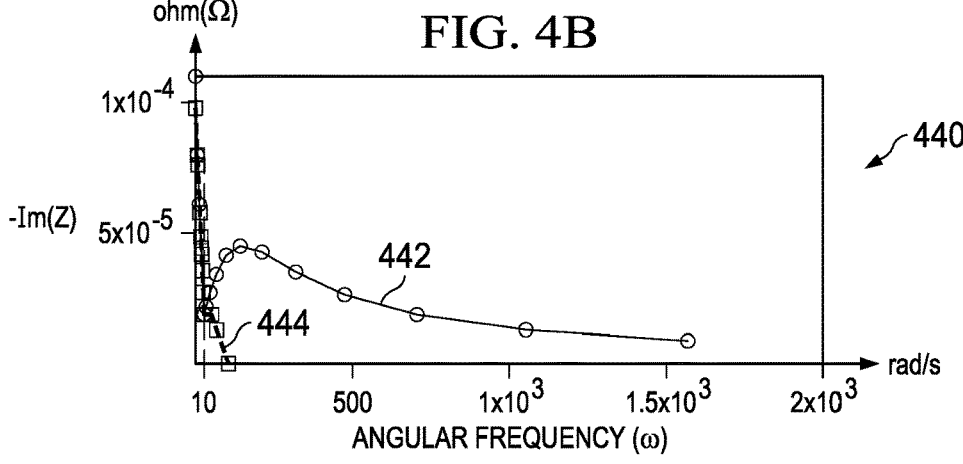
Figure 4C:
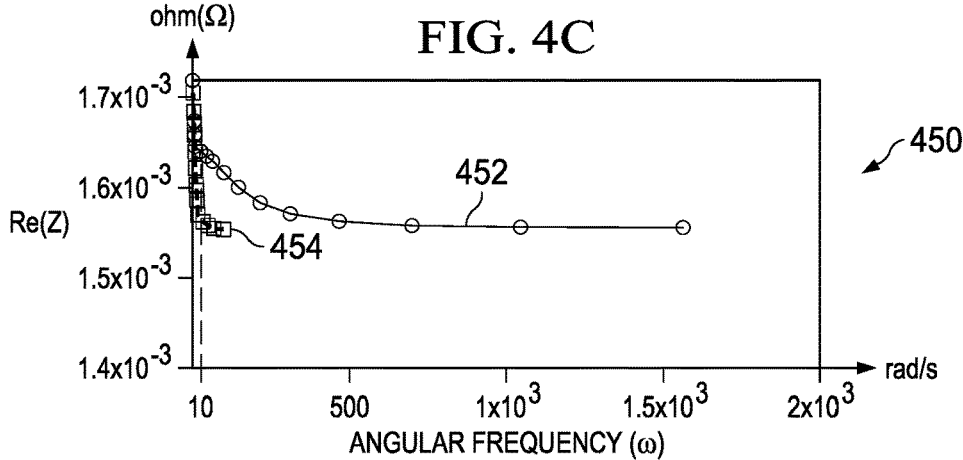

FIGS. 4A through 4C are graphs of example battery cell impedance spectrums generated from performing DFT operations on voltage and current signals containing non-periodic transient signals. FIG. 4A includes a graph 430 that shows a mapping 432 of real and imaginary components of the actual/target impedance spectrum, and a mapping 434 of real and imaginary components of an impedance spectrum determined from the DFT operations on the voltage and current signals. Also, FIG. 4B includes a graph 440 that shows a plot 442 of the imaginary components of the actual/target impedance spectrum and a plot 444 of the imaginary components of impedance spectrum from the DFT operations. Further, FIG. 4C includes a graph 450 that shows a plot 452 of the imaginary components of the actual/target impedance spectrum and a plot 454 of the imaginary components of impedance spectrum from the DFT operations. As shown in FIGS. 4A through 4C, substantial discrepancies exist between the actual/target impedance spectrum and the impedance spectrum computed from the results of the DFT operations, especially at frequencies beyond 10 rad/s.

Figure 5A:
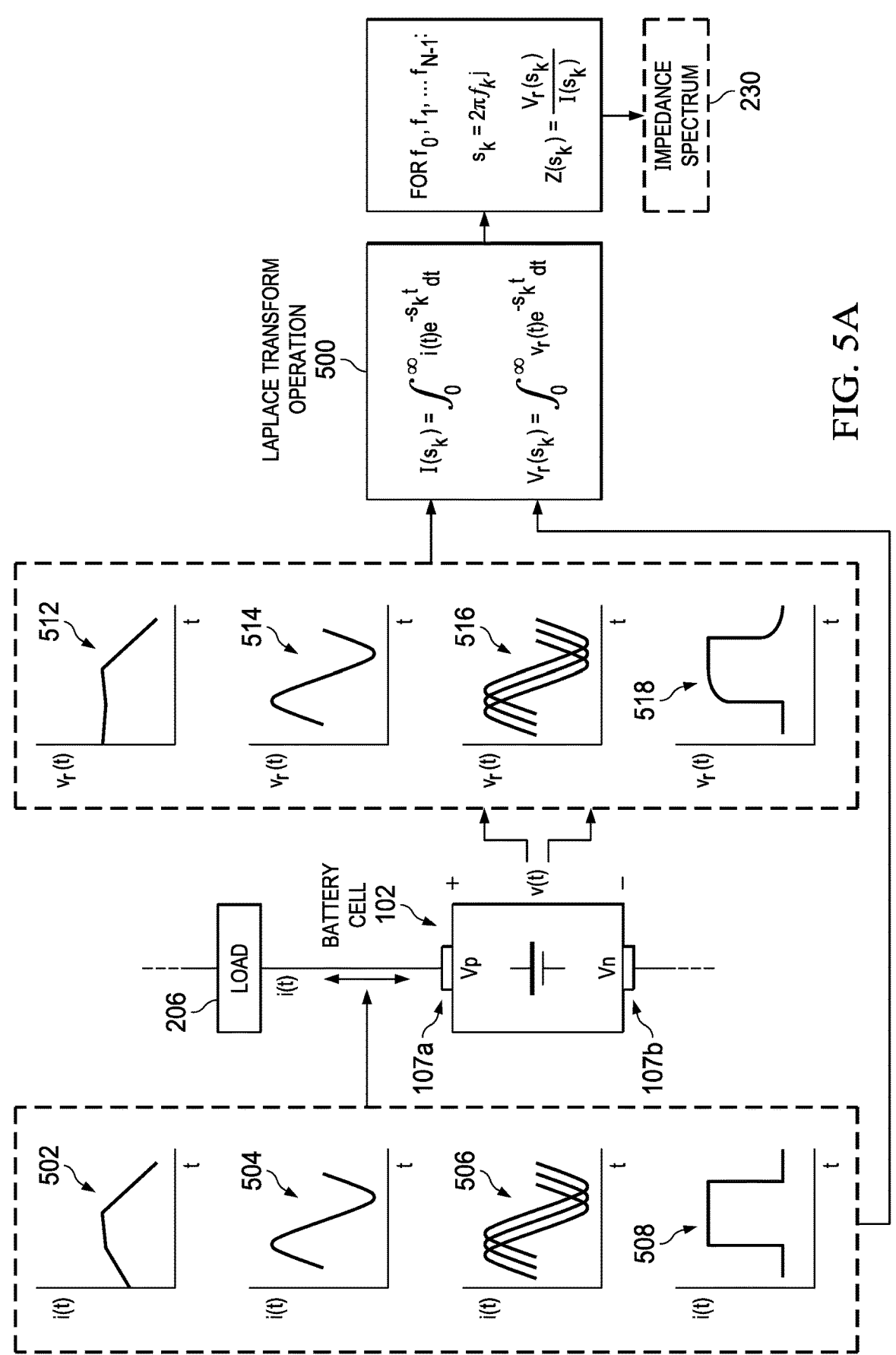
FIGS. 5A through 5C include data flow diagrams of example battery cell spectra measurement operations, in accordance with various examples.
Figure 5B:
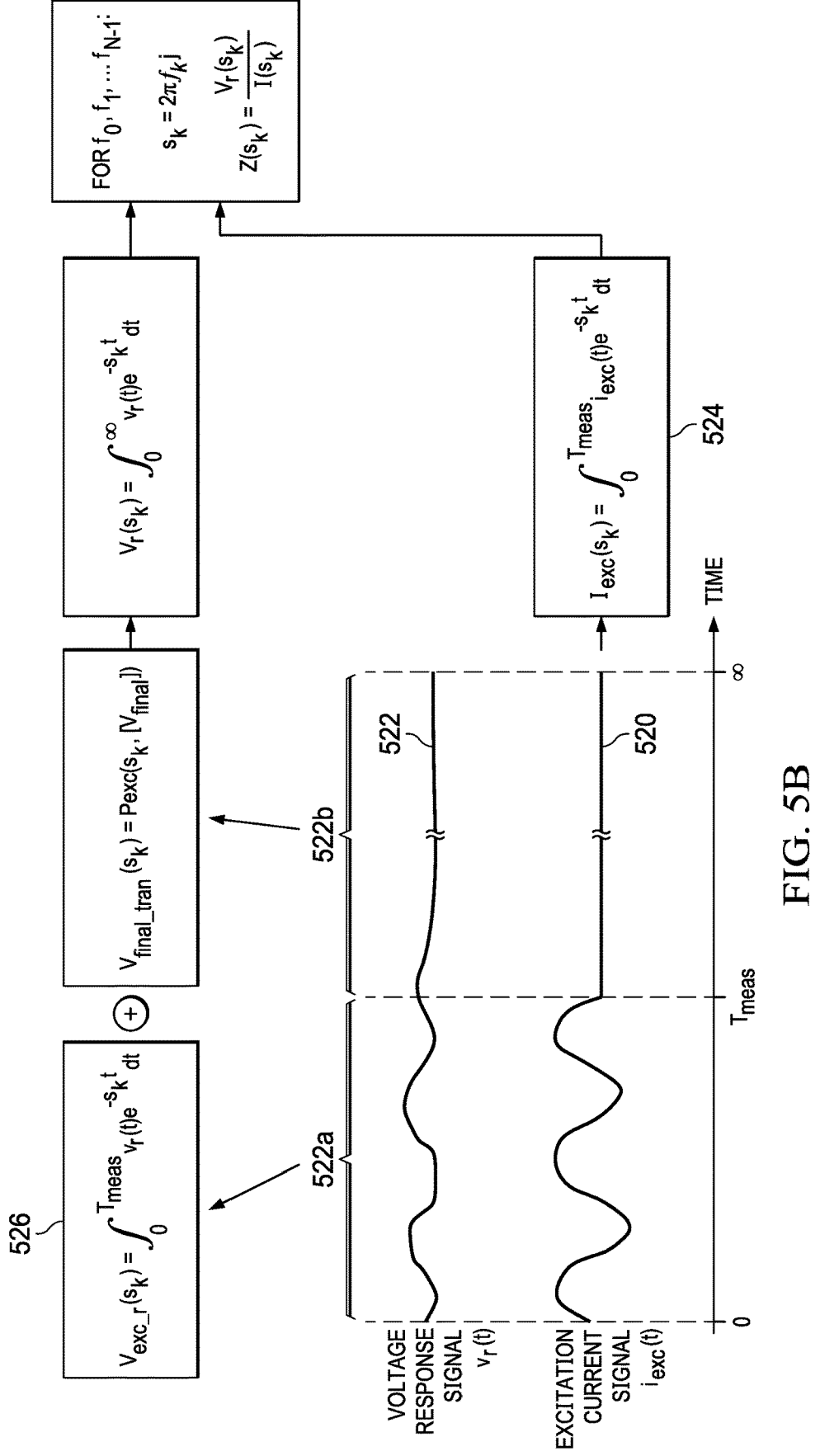
Figure 5C:
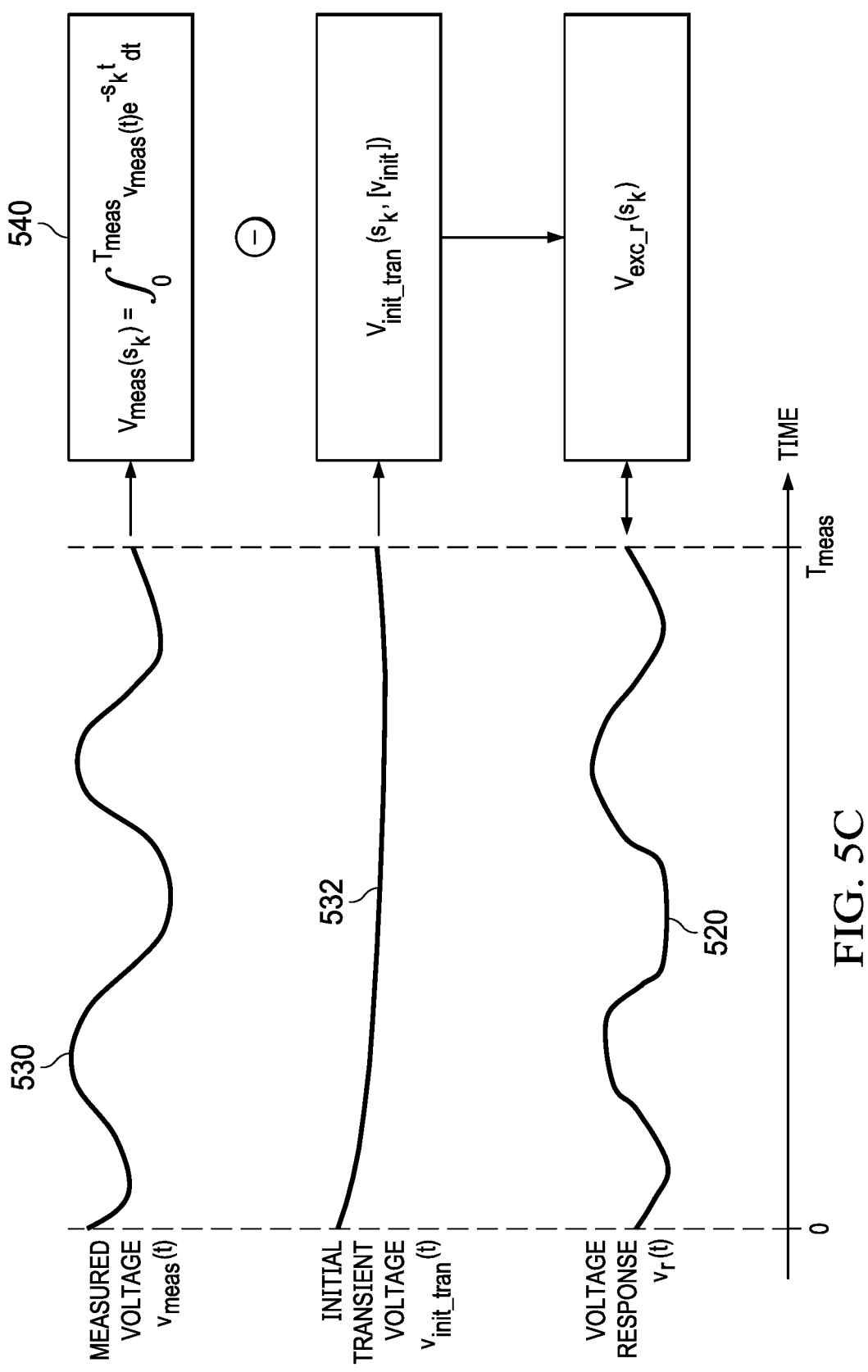

FIGS. 5A through 5C illustrate data flow diagrams of example battery cell impedance spectra measurement operations that can address at least some of the issues described above. As shown in FIG. 5A, controller circuit 220 can perform a transform operation 500 that does not require the input signal to be periodic nor to have matching initial and final conditions. Controller circuit 220 can perform transform operation 500 on measurements of current signal i(t) and voltage signal v(t) of battery cell 102 to compute the respective current spectrum and voltage spectrum. In some examples, transform operation 500 can be based on a Laplace transform operation, and the Laplace transforms of the current signal and the voltage signal can be computed based on the following equations:

$$I(s_k) = \int_0^\infty i(t)e^{-s_k t}dt \qquad \text{(Equation 4)}$$

$$V(s_k) = \int_0^\infty v(t)e^{-s_k t}dt \qquad \text{(Equation 5)}$$

In Equations 4 and 5, i(t) is a continuous time function representing the variation of the current signal with respect to time t, and v(t) is a continuous time function representing the variation of the voltage signal with respect to time. Battery monitoring system 202 can sample the voltage signal and the current signal, and controller circuit 220 can perform transform operation 500 on the samples, in both galvanostatic measurement operation and potentiostatic measurement operation.

Moreover, the parameter $s_k$ is a s-domain parameter representing a complex frequency, and can be mapped to a frequency $f_k$ according to the following equation:

$$s_k = 2\pi f_k j \qquad \text{(Equation 6)}$$

In Equation 6, j is the unit imaginary number.

Accordingly, a set of N s-domain parameters {$s_0$, $s_1$, . . . $s_{N-1}$} can be mapped to a set of N frequencies {$f_0$, $f_1$, . . . $f_{N-1}$}, and each of Laplace transforms $I(s_k)$ and $V(s_k)$ can represent a spectral component of, respectively, the current signal and the voltage signal at frequency $f_k$. A set of N Laplace transforms (and spectral components) can be computed for the respective voltage and current signals.

To compute the Laplace transforms, controller circuit 220 can perform an integration operation for a first product between the current signal function i(t) and exponential function $e^{-s_k t}$ from time zero (t=0) to infinite time (t=∞) to compute $I(s_k)$. Moreover, controller circuit 220 can perform an integration operation for a second product between the voltage signal function v(t) and exponential function $e^{-s_k t}$ from time zero (t=0) to infinite time (t=∞) to compute $V(s_k)$. As to be described below, controller circuit 220 can compute $I(s_k)$ and $V(s_k)$ using various approximation techniques in lieu of or in addition to the integration operations. Controller circuit 220 can then compute impedance spectrum 230 based on computing a ratio between each respective voltage response spectral component $V(s_k)$ and current spectral component $I(s_k)$ for a set of s-domain parameters $s_k$ (each of which corresponds to a frequency $f_k$) as follows:

$$Z(s_k) = \frac{V(s_k)}{I(s_k)} \text{ for } k = 0 \text{ to } N - 1 \qquad \text{(Equation 7)}$$

Using a transform operation based on Laplace transform allows the impedance spectra measurement to be performed under arbitrary load conditions and without injection of external excitation current. This is because Laplace transform does not require the input signal to be periodic nor to have matching initial and final conditions. Therefore, the presence of non-periodic transient signals in the input voltage/current signal, as well as mismatching initial and final conditions of the signal, may not lead to substantial error in the signal spectrum as shown in FIGS. 4A through 4C. For example, referring to FIG. 5A, current signals of different forms and shapes, such as current signals 502, 504, 506, and 508, can be supplied to battery cell 102 (either by excitation source 226 or as part of a load current by load 206) to generate, respectively, voltage signals 512, 514, 516, and 518.

Also, in a case where injection of external excitation current is needed (e.g., because the load current does not have spectral components in the frequency of interest), the excitation current can be in the form of a discharge current from battery cell 102, and controller circuit 220 can still perform Laplace transform operation 500 on the voltage and current signals samples to generate a reasonably accurate impedance spectrum for battery cell 102. For example, referring back to FIG. 2B, PWM controller 226c can close switch 226b to short the terminals 101a and 101b of battery cell 102 to discharge the battery cell, and the discharge current can be measured by measuring a voltage across resistor 226a. Such arrangements can reduce the complexity, energy inefficiency, and hazard associated with injecting a positive and periodic current signal into battery cell 102 by current source 226d to generate a periodic voltage signal across battery 100. Further, battery monitoring system 202 needs not wait for battery cell 102 to be in steady state to sample and measure the current and voltage signals, and the measurement period can be shortened to account for dynamic operation conditions of the battery cell.

While the Laplace transform operations in Equations 4 and 5 include integration operations of an input signal (current signal i(t) and voltage response v(t)) from time zero (t=0) to infinite time (t=∞), the portion of input signal being transformed can be time limited to reduce the quantities of current and voltage signals samples to be collected and digitized by current measurement circuit 222 and voltage measurement circuit 224, and to reduce the amount of computations to be performed by controller circuit 220 to generate the impedance spectrum.

FIG. 5B and FIG. 5C illustrate data flow diagrams of examples of Laplace transform operation 500 on input signals that are time limited. Referring to FIG. 5B, as part of a galvanostatic measurement, excitation source 226 can supply an excitation current signal 520 (labelled $i_{exc}(t)$ in FIG. 5B) to battery cell 102 within a measurement period that spans from time zero (t=0) to excitation time end time (t=$T_{meas}$), and battery cell 102 can produce a voltage response signal 522 (labelled $v_r(t)$ in FIG. 5B) in response to the excitation current signal. The excitation current signal $i_{exc}(t)$ can be regarded as zero after t=$T_{meas}$. The excitation current signal $i_{exc}(t)$ can be either set to zero by the current source that provides the excitation current, or can be regarded as zero if controller circuit 220 do not include samples of the excitation current signal collected after time $T_{meas}$ in the impedance spectra measurement operation. The duration of the measurement period can be based on the lowest frequency of interest. For example, if the spectral components of impedance spectrum to be measured has the lowest frequency of 1 kHz, the measurement period can span at least one cycle of 1 kHz, which is 1 milli-second (ms). The measurement period may span multiple cycles.

Controller circuit 220 can compute a Laplace transform of the current signal $I_{exc}(s_k)$ as the current spectrum based on an integration operation 524 between t=0 and t=$T_{meas}$ for a product between $i_{exc}(t)$ and exponential function $e^{-s_k t}$ as follows:

$$I_{exc}(s_k) = \int_0^{T_{meas}} i_{exc}(t)e^{-s_k t}dt \qquad \text{(Equation 8)}$$

While the current spectrum is computed based on current signal i(t) that is timed limited between t=0 and t=$T_{meas}$, the voltage response $v_r(t)$ can span from time zero to a theoretically infinite time. Referring to FIG. 5B, the voltage response $v_r(t)$ can have two portions: a first portion 522a that spans from time zero to time $T_{meas}$, and a second portion 522b from time $T_{meas}$ to infinity. First portion 522a can represent a response of battery 100 to the current excitation signal between t=0 and t=$T_{meas}$, and second portion 522b can represent a final transient voltage $v_{final}$ of battery 100 after the current signal is removed, such as discharge voltages from the capacitors of electrical model 110 (e.g., $C_1$, $C_2$, $C_3$, $C_S$, etc.).

Controller circuit 220 can compute the spectral components $V_r(s_k)$ based on a Laplace transform operation of voltage response $v_r(t)$, and the Laplace transform operation can include two portions. Controller circuit 220 can perform a first portion of the Laplace transform operation based on an integration operation 526 of a product between first portion 522a of voltage response $v_r(t)$ and exponential function $e^{-s_k t}$ as follows:

$$V_{exc\_r}(s_k) = \int_0^{T_{meas}} v_r(t)e^{-s_k t}dt \qquad \text{(Equation 9)}$$

Also, controller circuit 220 can perform a second portion of the Laplace transform operation, for second portion 522b of voltage response $v_r(t)$ between t=$T_{meas}$ to t=∞, based on determining the internal transient voltages across internal capacitors $C_1$, $C_2$, $C_3$, and $C_S$ of electrical model 110 after the end of the measurement period as follows:

$$V_{final\_tran}(s_k) = Pexc(s_k, [v_{final}]) \qquad \text{(Equation 10)}$$

In Equation 10, $Pexc(s_k, v_{final})$ can be a function that approximates a second portion of the Laplace transform of voltage response $v_r(t)$ from t=$T_{meas}$ to t=∞, in which the array $[v_{final}]$ represents an array of final internal voltages of electrical model 110 at t=$T_{meas}$. As to be described below, the Pexc function can be determined based on the final voltages of electrical model 110 at t=$T_{meas}$, the resistances of resistors $R_1$, $R_2$, $R_3$, and $R_S$ of electrical model 110, and the capacitances of capacitors $C_1$, $C_2$, $C_3$, and $C_S$ of electrical model 110. With such arrangements, battery monitoring system 202 is not required to measure the voltage response $v_r(t)$ beyond the measurement period $T_{meas}$ to compute the voltage spectrum.

Controller circuit 202 can obtain an approximate of the Laplace transform of voltage response $V_r(s_k)$ based on summing $V_{exc\_r}(s_k)$ (obtained based on Equation 9) and $V_{final\_tran}(s_k)$ (obtained based on Equation 10) as follows:

$$V_r(s_k) = \int_0^\infty v_r(t)e^{-s_k t}dt = V_{exc\_r}(s_k) + V_{final\_tran}(s_k) \qquad \text{(Equation 11)}$$

Controller circuit 202 can then compute impedance spectrum 230 of battery cell 102 based on computing a ratio between each respective voltage response spectral component $V(s_k)$ and current spectral component $I(s_k)$ at a given s-domain parameter $s_k$ (which corresponds to a frequency $f_k$) as described in Equation 7.

Referring to FIG. 5C, in a case where battery cell 102 has a non-zero initial condition (e.g., non-zero state of charge), voltage measurement circuit 224 can receive voltage signal 530 across battery cell 102 (labelled $v_{meas}(t)$ in FIG. 5C) that includes an initial transient voltage component 532 (labelled $v_{init\_tran}(t)$ in FIG. 5C) and voltage response signal 520 ($v_r(t)$ in FIG. 5C). Initial transient voltage component 532 can represent discharging voltages from the capacitors of electrical model 110 from their initial voltages at the beginning of the measurement period. Due to the superimposition of voltage response $v_r(t)$ and the discharging $v_{init\_tran}(t)$, the DC level of voltage signal 530 ($v_{meas}(t)$) can exhibit some degrees of drooping as shown in FIG. 5C. The spectral components of the voltage response signal $v_r(t)$ within the measurement period ($V_{exc\_r}(s_k)$) can be related to the spectral components of the measured voltage $v_{meas}(t)$ ($V_{meas}(s_k)$) and the spectral components of the initial transient voltage $v_{init}(t)$ ($V_{init}(s_k)$), as follows:

$$V_{meas}(s_k) = V_{exc\_r}(s_k) + V_{init\_tran}(s_k, [v_{init}]) \qquad \text{(Equation 12)}$$

To obtain $V_{exc\_r}(s_k)$, controller circuit 220 can perform an integration operation 540 on the measured voltage signal across battery cell 102, $v_{meas}(t)$, between t=0 and t=$T_{meas}$ to obtain $V_{meas}(s_k)$ as follows:

$$V_{meas}(s_k) = \int_0^{T_{meas}} v_{meas}(t)e^{-s_k t}dt \qquad \text{(Equation 13)}$$

The result of integration operation 540 can represent a Laplace transform of $v_{meas}(t)$ between t=0 and t=$T_{meas}$ where $v_{meas}(t)$ is zero after the measurement period ends.

Moreover, controller circuit 220 can compute the spectral components of the initial transient voltage $v_{init\_tran}(t)$, $V_{init\_tran}(s_k, [v_{init}])$, based on an array of initial internal voltages of electrical model 110, $[v_{init}]$, at t=0. As to be described below, controller circuit 220 can determine parameters representing the $V_{init\_tran}(s_k, [v_{init}])$ function based on the initial voltages of electrical model 110 at t=$T_0$, the resistances of resistors $R_1$, $R_2$, $R_3$, and $R_S$ of electrical model 110, and the capacitances of capacitors $C_1$, $C_2$, $C_3$, and $C_S$ of electrical model 110. Controller circuit 220 can then determine the voltage response spectral components $V_{exc\_r}(s_k)$ for the voltage response during the measurement period based on subtracting $V_{init\_tran}(s_k, [v_{init}])$ from $V_{meas}(s_k)$ for each $s_k$ to generate the voltage spectrum.

Combining Equations 4-13, the impedance $Z[s_k]$ in the s-domain can be determined from the measured voltage $v_{meas}(t)$, the excitation current signal i(t), the Laplace transform of the initial transient voltage $V_{init\_tran}(s_k, [v_{init}])$, and the Laplace transform of the final transient voltage $V_{final\_tran}(s_k, v_{final})$ based on the following Equations:

$$Z(s_k) = \frac{V_{meas}(s_k) - Pexc(s_k, [v_{final}])}{I(s_k)} \qquad \text{(Equation 14)}$$

Equation 13 can be rewritten as follows:

$$Z(s_k) = \frac{\int_0^{T_{meas}} v_{meas}(t)e^{-s_k t}dt - V_{init\_tran}(s_k, [v_{init}]) + Pexc(s_k, [v_{final}])}{\int_0^{T_{meas}} i_{exc}(t)e^{-s_k t}dt} \qquad \text{(Equation 15)}$$

Although FIGS. 5A through 5C illustrate a galvanostatic measurement operation, the techniques described herein can also be applied to a potentiostatic measurement operation. In such a case, excitation source 226 can apply an excitation voltage signal to battery cell 102 between t=0 and t=$T_{meas}$ Controller circuit 220 can compute the spectral components of the excitation voltage signal based on an integration operation of the excitation voltage signal between t=0 and $T_{meas}$. Controller circuit 220 can also compute the spectral components of the current response based on combining the integration result of a first portion of the current response signal between t=0 and t=$T_{meas}$ with approximations of spectral components contributed by the initial and final transients of the current signals in battery cell 102. Controller circuit 220 can compute the approximates of spectral components contributed by the initial and final transients of the current signals in battery cell 102 based on similar techniques as described above in Equations 9-15.

As described above, controller circuit 220 can perform the integration operations to compute the Laplace transforms of measured voltage signal $v_{meas}(t)$ and current excitation signal $i_{exc}(t)$ within the measurement period, such as integration operations 524 and 526 of FIG. 5B as described in Equations 8 and 13. Controller circuit 220 can perform the integration operations based on approximation operations using the current and voltage signal samples obtained by, respectively, current measurement circuit 222 and voltage measurement circuit 224 within the measurement period between t=0 and t=$T_{meas}$. Specifically, to reduce the computations involved in the integration operations, controller circuit 220 can select a function that approximates the continuous-time variations of current/voltage signal and that also has an analytical Laplace transform expression. Controller circuit 220 can then use parameters of the analytical Laplace transform expression to compute approximations of the Laplace transforms of current signal $i_{exc}(t)$ and voltage signal $v_{meas}(t)$. Some examples of functions and their analytical Laplace transform expressions are provided in Table 1 below:

TABLE 1

| Function f(t) | Analytical Laplace transform expression F(s) |
|---|---|
| Linear piecewise interpolation function $f(t) = x(t_j) + \left(\dfrac{x(t_{j+1}) - x(t_j)}{t_{j+1} - t_j}\right)(t - t_j)$ | $F(s_k) = \left(\dfrac{x(t_j)}{s_k} + \dfrac{\left(\dfrac{x(t_{j+1}) - x(t_j)}{t_{j+1} - t_j}\right)}{s_k^2}\right)e^{-s_k t_j} - \left(\dfrac{x(t_{j+1})}{s_k} + \dfrac{\left(\dfrac{x(t_{j+1}) - x(t_j)}{t_{j+1} - t_j}\right)}{s_k^2}\right)e^{-s_k t_{j+1}}$ |
| Heaviside step function $f(t) = \Phi(t - t_j) - \Phi(t - t_{j+1})$ | $F(s_k) = \dfrac{e^{-s_k t_j} - e^{-s_k t_{j+1}}}{s_k}$ |
| Pulse function $f(t) = \delta(t - t_j)$ | $F(s_k) = e^{-s_k t_j}$ |

Controller circuit 220 can compute the approximates of the Laplace transform of the current/voltage signals within the measurement period based on combining samples of voltage/current signals (collected within the measurement period) with parameters of the analytical Laplace transform expression, and computing the values of the combination for different s-domain parameters $s_k$. The Laplace transform approximates can represent the spectral components contributed by the current/voltage signals within the measurement period.

Figure 6:
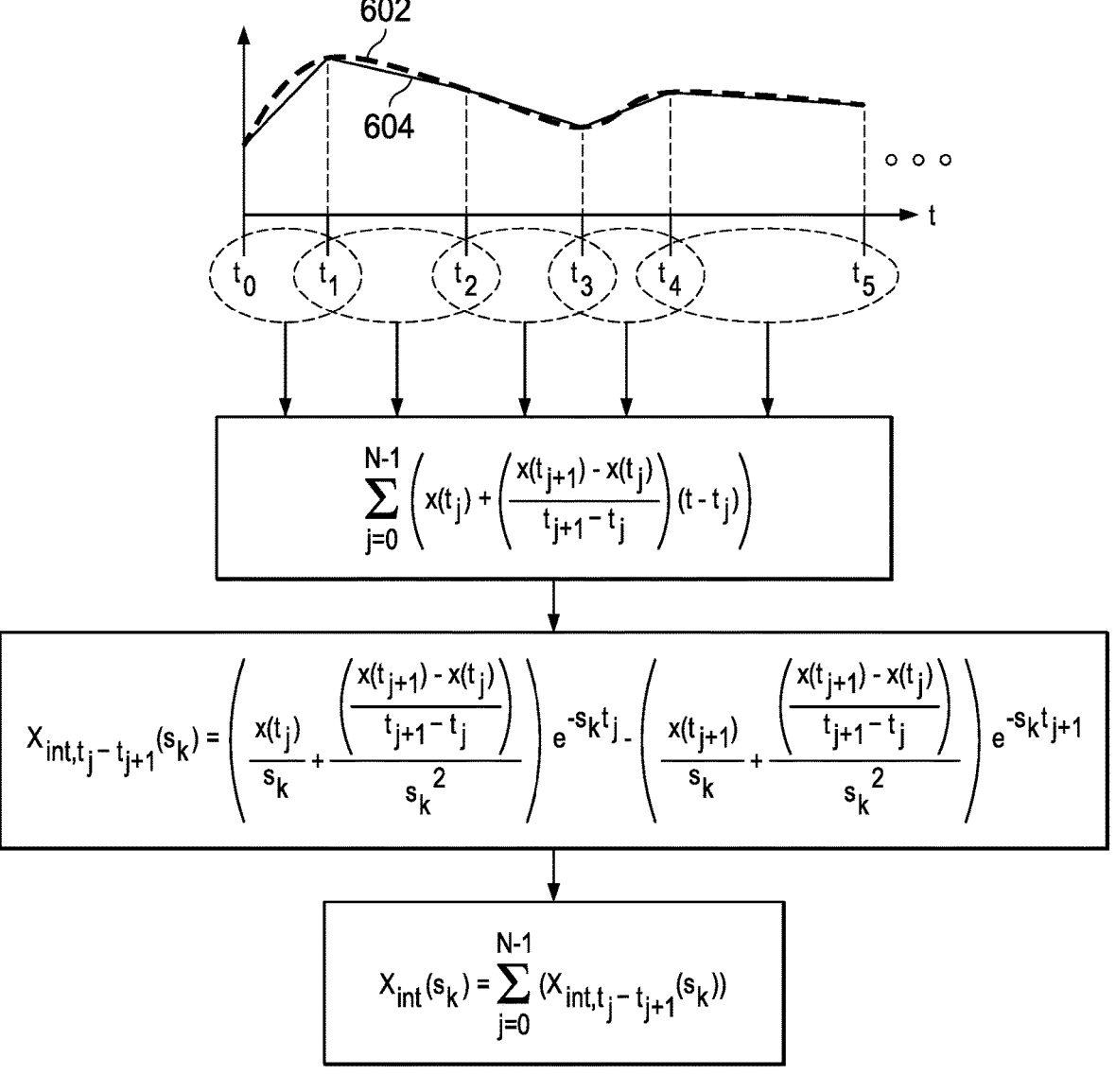
FIGS. 6, 7 and 8 illustrate data flow diagrams of example operations to compute Laplace transform approximates, in accordance with various examples.

FIG. 6 is a data flow graph of example computations of the Laplace transform approximates using a linear piecewise interpolation function in Table 1. In FIG. 6, signal 602 can be a voltage signal or a current signal. In FIG. 6, for each pair of neighboring signal samples of signal 602 sampled (by current measurement circuit 222 and voltage measurement circuit 224) at t=$t_j$ and t=$t_{j+1}$, controller circuit 220 can determine a linear piecewise interpolation function 604 based on computing a slope of signal 602 between the pair of neighboring signal samples, as follows:

$$x_{int}(t) = \sum_{j=0}^{N-1}\left(x(t_j) + \left(\frac{x(t_{j+1}) - x(t_j)}{t_{j+1} - t_j}\right)(t - t_j)\right) \quad \text{(Equation 16)}$$

In Equation 16, x(t) can be function that represents signal 602, and $x_{int}(t)$ can represent linear piecewise interpolation function 604. The time difference between sampling times $t_j$ and $t_{j+1}$ can be constant or variable between different pairs of samples. In Equation 16, the first signal sample can be obtained at t=$t_0$ and the last signal sample is obtained at t=$t_{N-1}$, and a total of N signal samples can be involved in the computation.

Referring back to Table 1, a linear piecewise interpolation function between two neighboring samples has an analytical Laplace transform expression, as follows:

$$X_{int,t_j-t_{j+1}}(s_k) = \left(\frac{x(t_j)}{s_k} + \frac{\left(\frac{x(t_{j+1}) - x(t_j)}{t_{j+1} - t_j}\right)}{s_k^2}\right)e^{-s_k t_j} - \quad \text{(Equation 17)}$$
$$\left(\frac{x(t_{j+1})}{s_k} + \frac{\left(\frac{x(t_{j+1}) - x(t_j)}{t_{j+1} - t_j}\right)}{s_k^2}\right)e^{-s_k t_{j+1}}$$

Accordingly, by combining Equations 16 and 17, the Laplace transform approximate of signal 602 over signal samples between t=$t_0$ and t=$t_{N-1}$ can be computed based on summing the analytical Laplace transform expression evaluated at different pairs of neighboring samples, as follows:

$$X_{int}(s_k) = \sum_{j=0}^{N-1}\left(X_{int,t_j-t_{j+1}}(s_k)\right) \quad \text{(Equation 18)}$$

Controller circuit 220 can compute the Laplace transform approximates of the excitation current signals $i_{exc}(t)$ and the measured voltage $v_{meas}(t)$ based on samples of the current and voltage signals collected within the measurement period based on Equation 18. For example, controller circuit 220 can compute the Laplace transform approximates of the measured voltage $v_{meas}(t)$, $V_{meas,int}(s_k)$, as follows:

$$V_{meas,int}(s_k) = \quad \text{(Equation 19)}$$
$$\sum_{j=0}^{N-1}\left[\left(\frac{v_{meas}(t_j)}{s_k} + \frac{1}{s_k^2}\left(\frac{v_{meas}(t_{j+1}) - v_{meas}(t_j)}{t_{j+1} - t_j}\right)\right)e^{-s_k t_j}\right.$$
$$\left. - \left(\frac{v_{meas}(t_{j+1})}{s_k} + \frac{1}{s_k^2}\left(\frac{v_{meas}(t_{j+1}) - v_{meas}(t_j)}{t_{j+1} - t_j}\right)\right)e^{-s_k t_{j+1}}\right]$$

Moreover, controller circuit 220 can compute the Laplace transform approximates of the excitation current signal $i_{exc}(t)$, $I_{exc,int}(s_k)$, as follows:

$$I_{exc,int}(s_k) = \sum_{j=0}^{N-1}\left[\left(\frac{i_{exc}(t_j)}{s_k} + \frac{1}{s_k^2}\left(\frac{i_{exc}(t_{j+1}) - i_{exc}(t_j)}{t_{j+1} - t_j}\right)\right)e^{-s_k t_j}\right. \quad \text{(Equation 20)}$$
$$\left. - \left(\frac{i_{exc}(t_{j+1})}{s_k} + \frac{1}{s_k^2}\left(\frac{i_{exc}(t_{j+1}) - i_{exc}(t_j)}{t_{j+1} - t_j}\right)\right)e^{-s_k t_{j+1}}\right]$$

In Equations 19 and 20, the first signal sample can be obtained (by current measurement circuit 222 and voltage measurement circuit 224) at t=$t_0$, and the last signal sample can be obtained at t=$t_{N-1}$, and a total of N signal samples can be collected within the measurement period.

To compute impedance $Z(s_k)$ to generate battery cell impedance spectrum 230, controller circuit 220 can compute $V_{meas,int}(s_k)$ to approximate $V_{meas}(s_k)$. Controller circuit 220 can also compute $I_{exc,int}(s_k)$ to approximate $I_{exc}(s_k)$. Controller circuit 220 can also compute the Laplace transforms of final transient voltage $Pexc(s_k, [V_{final}])$ and initial transient voltage $V_{init\_tran}(s_k, [v_{init}])$. Controller circuit 220 can then compute impedance $Z(s_k)$ as follows:

$$Z(s_k) = \frac{V_{meas,int}(s_k) + Pexc(s_k, [v_{final}]) - V_{init_{tran}}(s_k, [v_{init}])}{I_{exc\_init}(s_k)} \quad \text{(Equation 21)}$$

Figure 7:
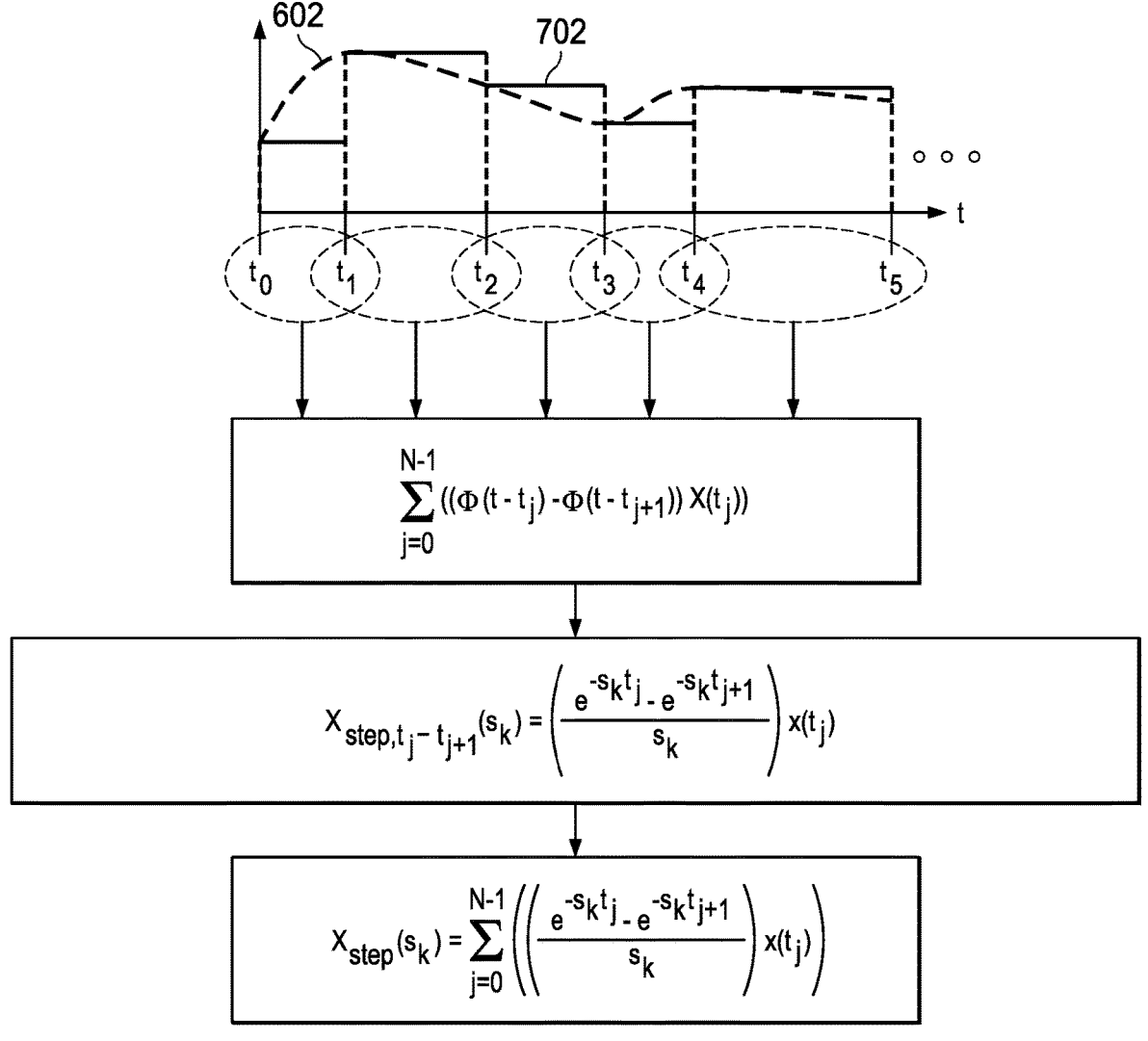

FIG. 7 is a data flow graph of example computations of the Laplace transform approximates using a Heaviside step function of Table 1. In FIG. 7, a Heaviside step function 702 can be used to approximate signal 602. A Heaviside step function $\Phi(t)$ can be defined based on the following Equations:

$$\Phi(t) = \begin{cases} 1 & \text{if } t > 0 \\ 0 & \text{if } t < 0 \\ 0.5 & \text{if } t = 0 \end{cases} \qquad \text{(Equation 22)}$$

Referring to FIG. 7, between each pair of neighboring signal samples of signal 602 sampled at $t=t_j$ and $t=t_{j+1}$, controller circuit 220 can compute an approximation function 702 using Heaviside step function, as follows:

$$x_{step}(t) = \sum_{j=0}^{N-1} ((\Phi(t - t_j) - \Phi(t - t_{j+1}))x(t_j)) \qquad \text{(Equation 23)}$$

In Equation 23, $x(t_j)$ can represent a sampled signal value at $t=t_j$. The portion of approximation function 702 between $t=t_j$ and $t=t_{j+1}$ can have a constant value given by $x(t_j)$. The time difference between sampling times $t_j$ and $t_{j+1}$ can be constant or variable between different pairs of samples. In Equation 23, the first signal sample can be obtained at $t=t_0$ and the last signal sample can be obtained at $t=t_{N-1}$, and a total of N signal samples can be involved in the computation.

Referring back to Table 1, a step function can have an analytical Laplace transform expression, which can be combined with Equation 23 as follows:

$$X_{step, t_j - t_{j+1}}(s_k) = \left( \frac{e^{-s_k t_j} - e^{-s_k t_{j+1}}}{s_k} \right) x(t_j) \qquad \text{(Equation 24)}$$

Accordingly, by combining Equations 23 and 24, the Laplace transform approximate of signal 602 over signal samples between $t_0$–$t_{N-1}$ can be computed based on summing the analytical Laplace transform expression evaluated at different pairs of neighboring samples, as follows:

$$X_{step}(s_k) = \sum_{j=0}^{N-1} \left( \left( \frac{e^{-s_k t_j} - e^{-s_k t_{j+1}}}{s_k} \right) x(t_j) \right) \qquad \text{(Equation 25)}$$

Battery monitoring system 202 can compute the Laplace transform approximates of the excitation current signals $i_{exc}(t)$ and the measured voltage $v_{meas}(t)$ based on Equation 25, where samples of the current signals can replace $x(t_j)$ to compute $X_{step}(s_k)$ for the current spectral components, and samples of the voltage signals can replace $x(t_j)$ to compute $X_{step}(s_k)$ for the voltage spectral components.

Figure 8:
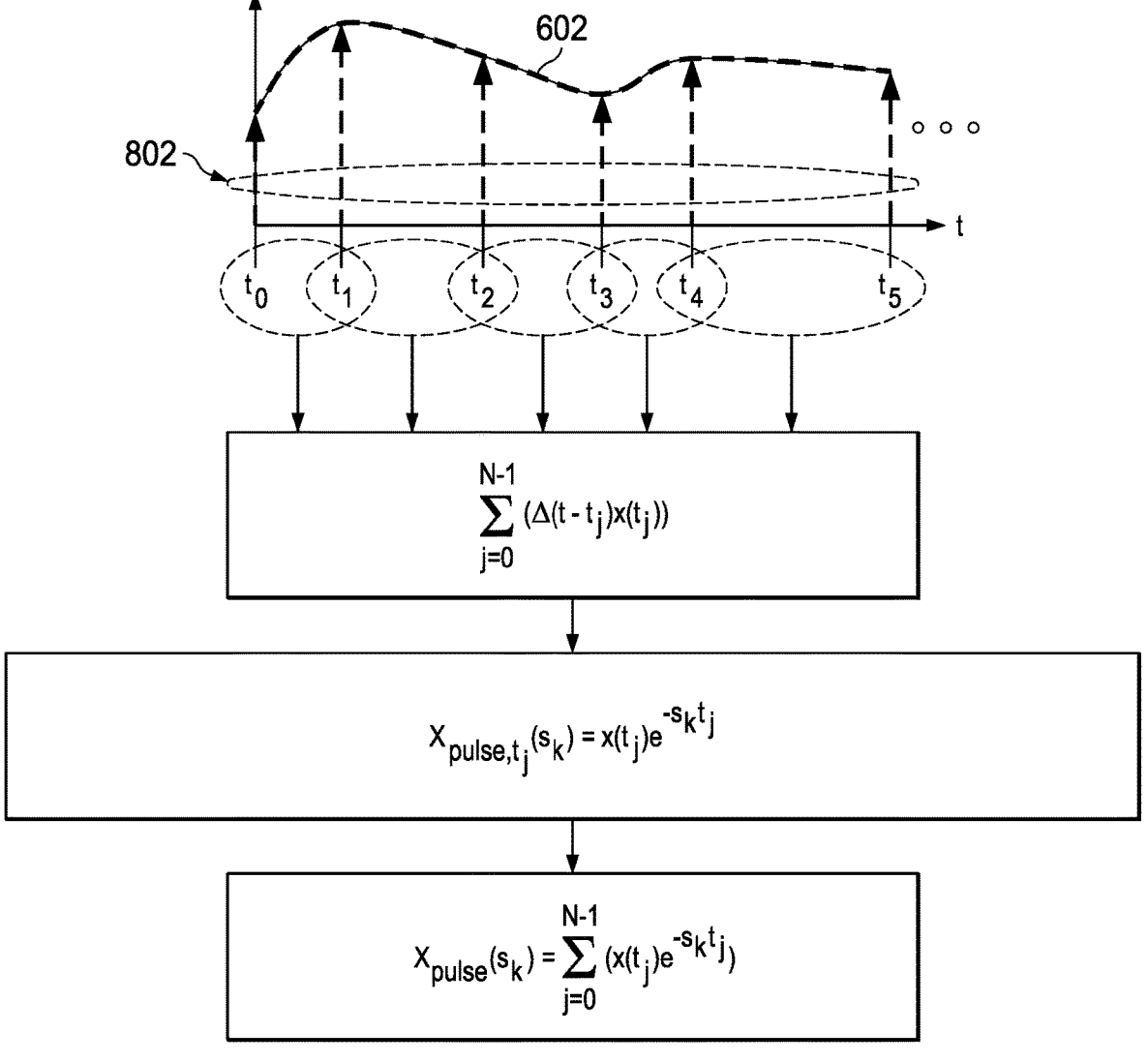

FIG. 8 is a data flow graph of example computations of the Laplace transform approximates using a pulse function of Table 1. In FIG. 8, a pulse function 802 can be used to approximate signal 602 at each sampling time. A pulse function $\delta(t)$ can be defined based on the following Equations:

$$\delta(t) = \begin{cases} 1 & \text{if } t = 0 \\ 0 & \text{if } t \neq 0 \end{cases} \qquad \text{(Equation 26)}$$

Referring to FIG. 8, signal samples $x(t_j)$ of signal 602 obtained at different time t can be approximated based on a sequence of pulses, as follows:

$$x_{pulse}(t) = \sum_{j=0}^{N-1} (\delta(t - t_j)x(t_j)) \qquad \text{(Equation 27)}$$

In FIG. 8, the time difference between sampling times $t_j$ and $t_{j+1}$ can be constant or variable between different pairs of samples. In Equation 27, the first signal sample is obtained at $t=t_0$ and the last signal sample is obtained at $t=t_{N-1}$, and a total of N signal samples are involved in the computation.

Referring back to Table 1, a pulse function has an analytical Laplace transform expression, which can be combined with Equation 27 as follows:

$$X_{pulse, t_j}(s_k) = x(t_j)e^{-s_k t_j} \qquad \text{(Equation 28)}$$

$$X_{pulse}(s_k) = \sum_{j=0}^{N-1} \left( x(t_j)e^{-s_k t_j} \right) \qquad \text{(Equation 29)}$$

Battery monitoring system 202 can compute the Laplace transform approximates of the excitation current signal $i_{exc}(t)$ and the measured voltage signal $v_{meas}(t)$ based on Equation 29, where samples of the current signals can replace $x(t_j)$ to compute $X_{step}(s_k)$ for the current spectral components, and samples of the voltage signals can replace $x(t_j)$ to compute $X_{step}(s_k)$ for the voltage spectral components.

In some examples, other transform operations, such as Z-transform, can be used to approximate Laplace transform, in a case where the excitation signal (current/voltage) comprises a sequence of uniform separated pulses, and the response signal is also sampled at a uniform sampling rate. For example, if battery cell 102 generates signal 602 in response to a sequence of uniform separated current pulses provided by excitation source 226, and a large number (N) of samples are obtained, the Laplace transform of signal 602 can be approximated based on Z-transform as follows:

$$X(z) = \sum_{j=0}^{\infty} \left( x(t_j)z^{-j} \right) \qquad \text{(Equation 30)}$$

The z-transform result $X(z)$ can be mapped to $X(s_k)$ as follows:

$$z = e^{-s_k \Delta t} \qquad \text{(Equation 31)}$$

In Equation 31, $\Delta t$ can represent the uniform sampling period (e.g., between $t_j$ and $t_{j+1}$).

In some examples, battery monitoring system 202 can select a function that approximates the continuous-time variations of current/voltage signals based on various criteria, such as computation power, sampling frequency, the characteristics of the excitation signal, etc. For example, if the excitation signal (current/voltage) comprises a sequence of uniform separated pulses, and the response signal is also sampled at a uniform sampling rate, battery monitoring system 202 can use pulse function to approximate the signal and compute the Laplace transform approximates based on Equations 30 and 31 above.

In addition, battery monitoring system 202 can select the function based on computation power and sampling frequency. Specifically, the analytical Laplace transform expressions of different functions can have different computation complexities and require different amounts of computation and/or memory resources to complete the computation. For example, in Table 1, the analytical Laplace transform of piecewise linear interpolation function may have the highest computation complexity and require the most computation and memory resources to complete, followed by step function and pulse function. Accordingly, in some examples, if battery monitoring system 202 is constrained by available computation and memory resources, it may select step function and/or pulse function over piecewise linear interpolation function to approximate the current/voltage signals, and compute the Laplace transform approximates based on the analytical Laplace transform expressions of step function and/or pulse function.

In some examples, battery monitoring system 202 may select a function based on the sampling frequency by which the current and voltage signals are sampled. Specifically, while piecewise linear interpolation function can provide more accurate approximation of the continuous-time variations of the signal than step function, the accuracy improvement may diminish at a high sampling rate. Accordingly, battery monitoring system 202 may select a step function to approximate the signal when the sampling rate is high, and may select a piecewise linear interpolation function when the sampling rate is low. In a case where battery monitoring system 202 samples the signal at a non-uniform sampling rate, battery monitoring system 202 may select different functions to compute the Laplace transform approximates for different samples, and add the approximates to compute the Laplace transform approximates for all the signal samples within the measurement The Laplace transform of initial transient voltage $V_{init\_tran}(s_k, [v_{init}])$ can be derived from a state-space model representation of electrical model 110. For example, from the state-space model, a transfer function between the response voltage signal and the excitation current signal can be obtained. Accordingly, controller circuit 220 can compute $V_{init\_tran}(s_k, [v_{init}])$ based on the following Equation:

$$V_{init\_tran}(s_k, [v_{init}]) = \sum_m \frac{v_m(0)}{1 + R_m C_m s_k} + \frac{v_{Cs}(0)}{s_k} \quad \text{(Equation 32)}$$

In Equation 32, $v_m(0)$ can represent the initial voltages $v_1$, $v_2$, and $v_3$ across, respectively, the $R_1C_1$, $R_2C_2$, and $R_3C_3$ parallel resistor-capacitor networks of electrical model 110 at t=0. $R_m$ represents the resistance of $R_1$, $R_2$, and $R_3$, $C_m$ represents the capacitance of $C_1$, $C_2$, and $C_3$, and $v_{Cs}(0)$ represents the voltage across series capacitor $C_S$ at t=0. The voltages $v_1(0)$ and $v_{Cs}(0)$ can be part of the $[v_{init}]$ array. Equation 32 can represent a transfer function (modelled by electrical model 110) that defines the voltage response of battery 100 for the excitation current signal. As to be described below, controller circuit 220 can determine the initial voltages as well as the R and C parameters based on an optimization operation.

In addition, controller circuit 220 can compute the Laplace transform of final transient voltage $Pexc(s_k, [v_{final}])$ based on the transfer function of Equation 32 with the same set of R and C parameters, but with the onset of response shifted by the measurement period duration $T_{meas}$, as follows:

$$Pexc(s_k, [v_{final}]) = e^{-s_k T_{exc}}\left(\sum_i \frac{v_1(T_{meas})}{1 + R_1 C_1 s_k} + \frac{v_{Cs}(T_{meas})}{s_k}\right) \quad \text{(Equation 33)}$$

Referring to Equations 21 and 33, when battery cell 102 operates in a steady state, the initial internal voltages $v_m(0)$ across the parallel $R_m C_m$ networks (e.g., $R_1C_1$, $R_2C_2$, and $R_3C_3$ networks of electrical model 110) at t=0 and the final internal voltages $v_1(T_{exc})$ at t=$T_{meas}$ can be substantially equal. Accordingly, portions of $V_{init\_tran}(s_k, [v_{init}])$ and $Pexc(s_k, [v_{final}])$ contributed by the $R_m C_m$ networks can cancel each other in the difference between the Laplace transforms of the initial transient voltage and of the final transient voltage, $Pexc(s_k, [v_{final}]) - V_{init_{tran}}(s_k, [v_{init}])$, and Equation 21 for impedance spectral component $Z(s_k)$ can be simplified and become:

$$Z(s_k) = \frac{V_{meas,int}(s_k) + e^{-s_k T_{meas}}\left(\frac{v_{Cs}(T_{meas})}{s_k} - \frac{v_{Cs}(0)}{s_k}\right)}{I_{exc\_int}(s_k)} = \quad \text{(Equation 34)}$$

$$\frac{V_{meas,int}(s_k) + e^{-s_k T_{meas}}\left(\frac{\Delta v_{Cs}}{s_k}\right)}{I_{exc\_int}(s_k)}$$

Referring again to Equation 21, the difference between the Laplace transforms of the initial transient voltage and of the final transient voltage, $Pexc(s_k, [v_{final}]) - V_{init_{tran}}(s_k, [v_{init}])$, can be simplified to a term based on the voltage difference $\Delta v_{Cs}$ across the series capacitor between t=0 and t=$T_{meas}$. The voltage difference $\Delta v_{Cs}$ can be independent from the RC parameters of electrical model 110.

Controller circuit 220 can determine the voltage difference $\Delta v_{Cs}$ based on various techniques, such as a linear regression of voltages across battery cell 102 with respect to the excitation current. Specifically, in a case where a varying excitation current signal is supplied to battery cell 102, battery monitoring system 202 can obtain multiple samples of the excitation current signal and the corresponding voltage response signal. Controller circuit 220 can generate a linear graph to fit the current and voltage response signal samples in a linear regression operation, and the linear graph can relate the voltage response signal to the current signal. In a case where the excitation current signal is periodic, the slope of the linear graph can provide $\Delta v_{Cs}$, the intercept of the linear graph can provide the capacitance of series capacitor $C_S$, and the effect of the voltages across capacitors $C_m$ on the voltage across battery cell 102 can be averaged out. In some examples, the capacitance of series capacitor $C_S$ can also be determined based on a rate of change in the stored charge with respect to the open circuit voltage (OCV) of battery 100.

FIG. 9 are graphs that illustrate example operation conditions in which battery cell 102 operates in a steady state, where controller circuit 220 can determine the impedance spectral component $Z(s_k)$ of impedance spectrum 230 based on Equation 34. The left side of FIG. 9 illustrates an operation condition 902. In operation condition 902, excitation source 226 can apply multiple cycles of a sinusoidal (or multi-sinusoidal) excitation current to battery cell 102 (e.g., by charging and/or discharging). Controller circuit 220 can control current measurement circuit 222 and voltage measurement circuit 224 to obtain respective samples of current signal i(t) and voltage signal $v_{meas}(t)$ in the last cycle(s) of the sinusoidal excitation current, battery cell 102 can be in the steady state. Accordingly, the initial internal voltages $v_m(0)$ and the final internal voltages $v_m(T_{meas})$ can be substantially equal across each of the parallel resistor-capacitor networks $R_m C_m$, and impedance spectral component $Z(s_k)$ can be determined based on the simplified Equation 34.

The right side of FIG. 9 illustrates another example operation condition 904 in which battery cell 102 can operate in a steady state. In operation condition 902, battery cell 102 can be in a well-relaxed/well-rested condition prior to the measurement period, which starts at time=0, and zero load current flows through load 206. This situation allows the initial internal voltages $v_m(0)$ to start at zero. Moreover, excitation source 226 can stop the application of i(t) at the $t=T_{stop}$, which starts a relaxation period, and the measurement period ends at $t=T_{meas}$. This situation allows the final internal voltages $v_m(T_{meas})$ to settle to zero as well and become equal to the initial internal voltages $v_m(0)$. Accordingly, the initial and final conditions can match, and controller circuit 220 can determine the impedance spectral component $Z(s_k)$ of impedance spectrum 230 based on Equation 34. In operation condition 902, controller circuit 220 can control current measurement circuit 222 and voltage measurement circuit 224 to obtain respective samples of current signal i(t) and voltage signal $v_{meas}(t)$ within the entire measurement period from t=0 to $t=T_{meas}$ including the relaxation period between $T_{stop}$ and $T_{meas}$.

In a case where initial and final conditions of battery cell 102 do not match, to account for $V_{init\_tran}(s_k, [v_{init}])$ and $Pexc(s_k, [v_{final}])$, controller circuit 220 can perform an optimization operation to determine the resistances $R_m$ (e.g., $R_1, R_2, R_3,$ and $R_S$) the capacitances $C_m$ (e.g., capacitance of capacitors $C_1, C_2, C_3,$ and $C_S$), as well as the internal voltage $v_{Rs}(t), v_m(t)$ and $v_{Cs}(t)$. The optimization operation can be performed over an array of $s_k$ values each corresponding to a frequency $f_k$. The array of $s_k$ values can be larger than the number of electrical model parameters to be determined, to improve the robustness of the estimation.

Specifically, controller circuit 220 can compute an initial estimate of the Laplace transform $V_{est}(s_k)$ of the measured voltages based on estimated R and C parameters and the Laplace transform approximate of the current signal $I_{exc\_int}(s_k)$ as follows:

$$V_{est}(s_k) = Z'(S_k)I_{exc\_int}(s_k) + P_{init}(s_k) - Pexc(s_k) \qquad \text{(Equation 35)}$$

$$Z'(S_k) = R_s + \sum_m \frac{R_m}{1 + R_m C_m s_k} \qquad \text{(Equation 36)}$$

$$P_{init}(s_k) = \sum_m \frac{v_m(0)}{1 + R_m C_m s_k} + \frac{v_{Cs}(0)}{s_k} \qquad \text{(Equation 37)}$$

$$Pexc(s_k) = e^{-s_k T_{meas}} \left( \sum_m \frac{v_1(T_{meas})}{1 + R_m C_m s_k} + \frac{v_{Cs}(T_{meas})}{s_k} \right) \qquad \text{(Equation 38)}$$

The objective of the optimization operations can be to minimize a cost function r. Controller circuit 220 can compute the cost function r based on a difference between the Laplace transform approximate of the measured voltages $V_{meas,int}(s_k)$ within the measurement period, and initial estimate of the Laplace transform $V_{est}(s_k)$, as follows:

$$r(s_k) = V_{meas,int}(s_k) - V_{est}(s_k) \qquad \text{(Equation 39)}$$

As described above, controller circuit 220 can compute $V_{meas,int}(s_k)$ and $I_{exc,int}(s_k)$ from, respectively, the measured voltage signal samples and current signal samples using the analytical Laplace transform expression of a function that approximates the variation of the voltage signal (e.g., a piecewise linear interpolation function, a step function, a pulse function, etc.). Controller circuit 220 can compute $V_{est}(s_k)$ based on $I_{exc,int}(s_k)$, as well as $Z'(s_k), P_{init}(s_k),$ and $Pexc(s_k)$ from initial estimates of parameters including the resistances $R_m$, capacitances $C_m$, initial states of internal voltages $v_m(0)$ and $v_{Cs}(0)$, and final states of internal voltages $v_m(T_{exc})$ and $v_{Cs}(T_{exc})$. In some examples, controller circuit 220 can determine the initial estimates of these parameters from impedance $Z(s_k)$ of battery cell 102 in steady state (e.g., from Equation 34). After obtaining the initial estimates, controller circuit 220 can perform the optimization operation based on solving a Non-Linear Least-Squares (NLLS) problem, which includes the computations of a residual fit error and an optimization cost function to obtain an optimal function over an array of $s_k$ values, as follows:

Computation of residual fit error:

$$r(k, [\beta]) = V_{meas,int}(s_k) - V_{est}(s_k, [\beta]) \qquad \text{(Equation 40)}$$

$$[r] = [r(1, [\beta]) \ldots r(N, [\beta])]^T \qquad \text{(Equation 41)}$$

$$[\beta] = [[R_1 \ldots R_M] [C_1 \ldots C_M]]] \qquad \text{(Equation 42)}$$

$$[V] = [V_{meas,int}(s_1) \ldots V_{meas,int}(s_N)]^T \qquad \text{(Equation 43)}$$

Optimization cost function:

$$Opt([r]) = \sum_{k=1}^{N} r(s_k, \beta) = [r]^T [r] \qquad \text{(Equation 44)}$$

Optimization solution:

$$\hat{\beta}^* = \arg\min_{\substack{R_p > 0 \\ C_p > 0}} r^T r \qquad \text{(Equation 45)}$$

At the end of the optimization operation, controller circuit 220 can determine the optimized parameters for the resistances $R_m$, capacitances $C_m$, initial states of internal voltages $v_m(0)$ and $v_{Cs}(0)$, and final states of internal voltages $v_m(T_{exc})$ and $v_{Cs}(T_{exc})$, and compute optimized functions $P_{init}^*(s_k)$ and $P^* exc(s_k)$ based on the optimized parameter values. Controller circuit 220 can then compute the impedance $Z(s_k)$ as follows:

$$Z(s_k) = \frac{V_{meas,init}(s_k) - P_{init}^*(s_k) + P^* exc(s_k)}{I_{int}(s_k)} \qquad \text{(Equation 46)}$$

As described above, the resistance and capacitance values in electrical model 110 may vary based on the operation conditions of battery cell 102, such as temperature and depth of discharge (DOD) of the battery. Accordingly, the frequency-dependent impedance Z of battery cell 102 can also vary according to the operation conditions. To improve the initiate estimates for $R_m, C_m, R_S$ and $C_S$ values at different state of charge and temperatures, which can speed up the optimization operation, battery monitoring system 202 can store, in a memory, a table that maps values of $R_m$, $C_m$, and $R_S$ parameters to different temperatures and depth of discharge (DOD), and fetch the initiate estimates for $R_m$, $C_m$, $R_S$ and $C_S$ values from the table to start the optimization operation based on a temperature and a DOD of the battery cell.

FIG. 10 illustrates an example of an RC parameter table 1000 that can be maintained by battery monitoring system 202 for battery cell 102. In RC parameter table 1000, each entry {R, C} includes a set of resistance values for $R_m$ and a set of capacitance values for $C_m$ and is mapped to a particular temperature and a particular DOD. For example, an entry {R, C}$_{2,1}$ is mapped to DOD_2 and temperature Temp_1.

In addition, the capacitance of series capacitor $C_S$, which can model the state of charge of battery cell 102, can be determined based on the total discharge capacity Qmax of battery cell 102 and a rate of change between the series capacitor voltage $v_{Cs}$ and DOD, as follows:

$$C_s = Q\max \times \frac{\Delta v_{Cs}}{\Delta DOD} \qquad \text{(Equation 47)}$$

Figure 11:
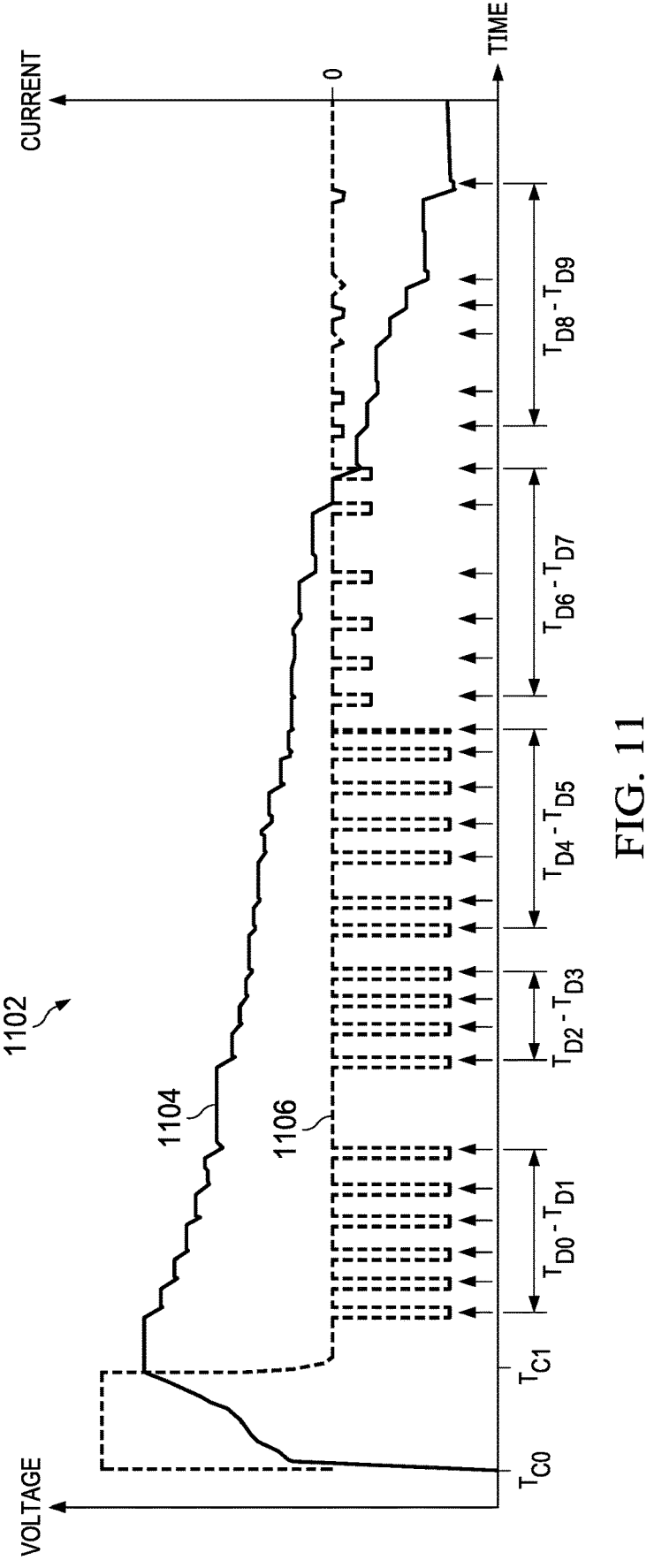
FIG. 11 is a graph of voltage and current measurements to support battery cell spectra measurements in operation conditions where the initial and final conditions of the battery mismatch, in accordance with various examples.

In some examples, the series capacitor voltage $v_{Cs}$, which can be an open circuit voltage (OCV), can be obtained from a discharge/relaxation test where the open circuit voltage data are obtained at the end of a discharge/relaxation period. FIG. 11 illustrates a graph 1102 showing an example of discharge/relaxation test performed on battery cell 102 at a temperature of 25° C. by battery monitoring system 202. Graph 1102 includes a plot 1104 of measured voltage $V_{meas}(t)$ across battery cell 102 with respect to time, and a plot 1106 of current i(t) that flows through battery cell 102 with respect to time. Plot 1106 shows that excitation source 226 charges battery cell 102 with a positive current between times $T_{C0}$ and $T_{C1}$, followed by sequences of discharges with a negative current pulse between $T_{D0}$ and $T_{D1}$, $T_{D2}$ and $T_{D3}$, $T_{D4}$ and $T_{D5}$, $T_{D6}$ and $T_{D7}$, and between $T_{D8}$ and $T_{D9}$.

During the discharge/relaxation test, each discharge current pulse can remove a pre-determined quantity of charge from battery cell 102 to change the DOD. Moreover, between each discharge current pulse zero current flows through battery cell 102, therefore battery cell 102 is in a relaxed state, and the measured voltage $V_{meas}$ from plot 1104 between consecutive discharge current pulses can represent an OCV data point as well as a series capacitor voltage $v_{Cs}$. From graph 1102, controller circuit 220 can determine a relationship between DOD (at each discharge current pulse) and OCV (between two discharge current pulses), and use the relationship to determine an initial estimate of $v_{Cs}$ (or OCV) as a function of DOD. The discharge/relaxation test can also be performed by battery monitoring system 202 on battery 100 over different temperatures (and for different DODs) to provide an initial estimate of $v_{Cs}$ as a function of both DOD and temperature.

In some examples, battery monitoring system 202 can determine the $R_m$ and $C_m$ parameters during the discharge/relaxation test to generate table 1000. For example, at the end of each relaxation that follows a discharge current pulse, which can set a particular DOD of battery 100, excitation source 226 can apply a sinusoidal (or multi-sinusoidal) excitation current signal (a charge current, a discharge current, or both) to battery cell 102, which then generates a voltage response signal. Current measurement circuit 222 and voltage measurement circuit 224 can generate digital samples of the respective current signal and voltage response signal, and controller circuit 220 can perform the aforementioned Laplace transform computations and optimization operations on the current and voltage response samples to determine the impedance spectrum as well as the $R_m$ and $C_m$ parameters for a particular DOD and temperature combination.

In some examples, battery monitoring system 202 can update RC parameter table 1000 to account for changes in the conditions of battery cell 102 caused by aging. For example, battery monitoring system 202 can update the initial estimates of the RC parameters in RC parameter table 1000 using the refined estimates of the RC parameters obtained from the optimization operation. Such arrangements allow controller circuit 220 to start the next optimization operation using initial estimates of the RC parameters that are closer to their optimized values, which can speed up and improve the accuracy of the optimization operation.

To update RC parameter table 1000, battery monitoring system 202 can determine a present DOD ($DOD_{present}$) based on the following Equation:

$$DOD_{present} = DOD_{initial} - \frac{Q\text{pass}}{Q\max} \qquad \text{(Equation 48)}$$

In Equation 48, $DOD_{initial}$ can be determined based on measuring the open circuit voltage (OCV) with zero current in the battery, and solving for the $DOD_{initial}$ from a function that relates OCV with DODs obtained from a discharge/relaxation test such as the one shown in FIG. 4G. In addition, Qpass can represent a quantity of charge that has been discharged from battery 100 between the times associated with $DOD_{initial}$ and $DOD_{present}$. For example, assuming that $DOD_{initial}$ and $DOD_{present}$ are computed for two neighboring digital samples, Qpass can be based on the sampling time between the two digital samples, the discharging current $i_{dis}$, sampling time interval $t_{sample}$, and Qmax as follows:

$$DOD_{present} = DOD_{initial} - \frac{i_{dis} \times t_{sample}}{Q\max} \qquad \text{(Equation 49)}$$

In Equation 49, both the discharging current $i_{dis}$ and sampling time interval $t_{sample}$ can vary between different samples.

After performing the optimization operations and determining a set of RC parameters, battery monitoring system 202 can access an {R, C} entry having the closest DOD with $DOD_{present}$. Battery monitoring system 202 can combine the R and C parameters in the {R, C} entry with the new R and C parameters obtained from the optimization operation. The combination can be based on various techniques, such as a linear interpolation operation, a weighted averaging operation, etc. For example, battery monitoring system 202 can compute means square errors for the R and C parameters in the {R, C} entry and for the new R and C parameters obtained from the optimization operation. The means square errors can be computed from line regression of multiple samples of the voltage/current values that give rise to the R and C parameters. Battery monitoring system 202 can use the means square errors to compute weights for the R and C parameters in the {R, C} entry and for the new R and C parameters, and compute a weighted average for each R and C parameter based on the weights. Battery monitoring system 202 can then store the weighted average R and C parameters in the {R, C} entry of table 1000.

Also, controller circuit 220 can use the total capacity of battery cell 102, represented by Qmax, to estimate DOD and the capacitance of series capacitor $C_S$. Controller circuit 220 can compute Qmax during an active discharge event (e.g., when excitation source 226 applies a discharge current pulse) based on the following Equation:

$$Qmax = \frac{Qpass}{DOD_{discharge} - DOD_{initial}} \qquad \text{(Equation 50)}$$

In Equation 50, Qpass represents the total quantity of charge discharged, which can be determined from the duration and the magnitude of the discharge current pulse. Moreover, $DOD_{initial}$ can be determined based on the OCV voltage before the discharge, whereas $DOD_{discharge}$ can be determined based on the OCV voltage after the discharge, from the function that relates OCV with DODs.

Figures 12A, 12B, 12C:
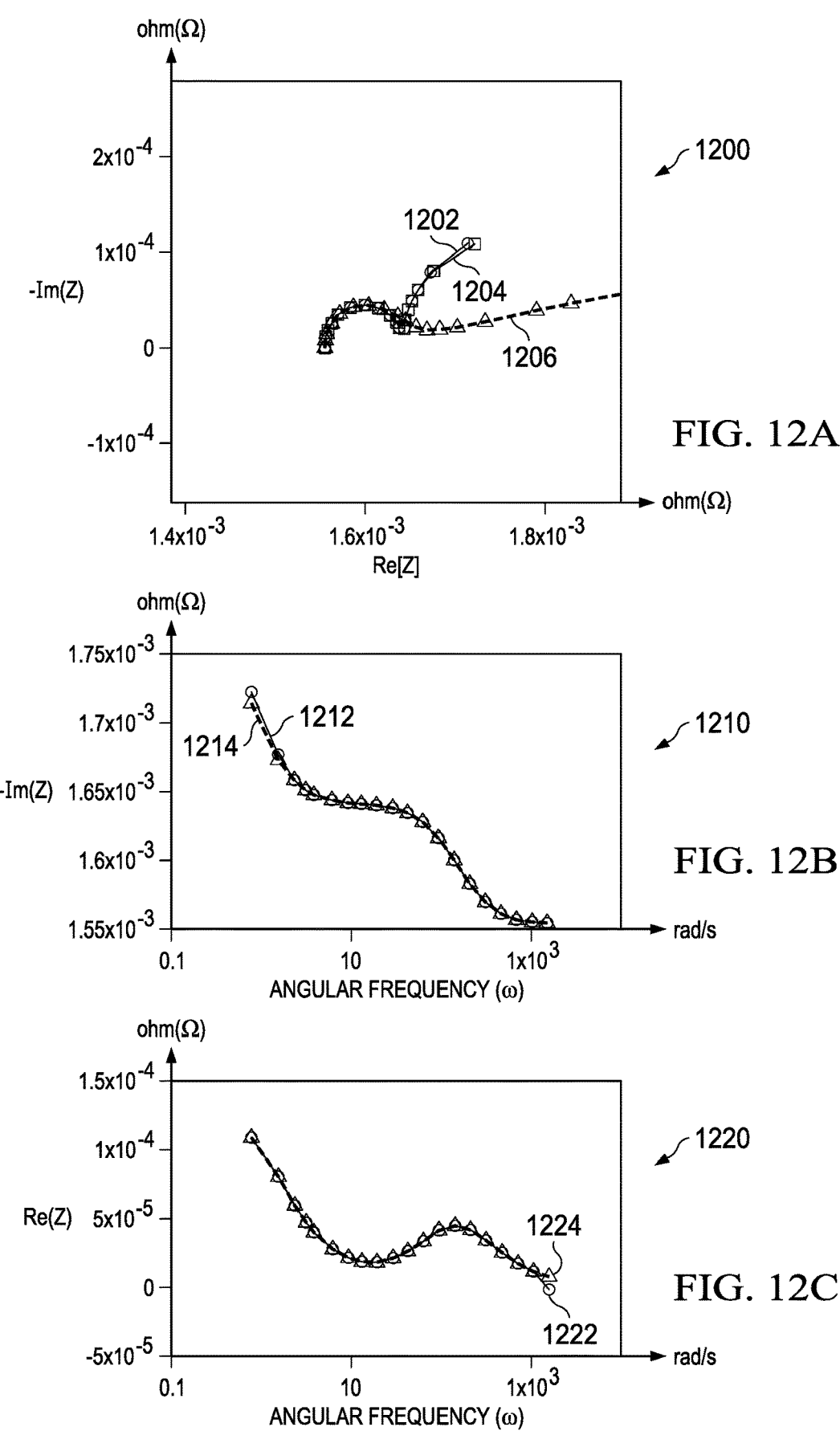
FIGS. 12A through 12C are graphs of example battery cell spectra measurement results using the example techniques of FIGS. 5A through 11.

FIGS. 12A through 12C are graphs of example impedance spectrums generated by battery monitoring system 202 using the example Laplace transform approximation techniques described in FIGS. 5A through 11. FIG. 12A includes a graph 1200 that shows mappings 1202, 1204, and 1206 of real and imaginary components of different impedance spectrums. Mapping 1202 is for the true impedance spectrum of battery cell 102, mapping 1204 is for an impedance spectrum determined using DFT, and mapping 1204 is for an impedance spectrum determined using the example Laplace transform approximation techniques of FIGS. 5A through 11. As shown in graph 1200, mappings of 1202 and 1206 (actual impedance and impedance from Laplace transform approximation) are closely matched, and mapping 1204 (impedance from DFT) deviate from both mappings of 1202 and 1206.

Also, FIG. 12B includes a graph 1210 that shows a plot 1212 of the imaginary components of the actual impedance and a plot 1214 of the imaginary components of impedance from Laplace transform approximation, both with respect to frequency. Further, FIG. 12C includes a graph 1220 that shows a plot 1222 of the real components of the actual impedance and a plot 1224 of the real components of impedance from Laplace transform approximation, both with respect to frequency. As shown in both graphs 1210 and 1220, the impedance spectral components from Laplace transform approximation match well with the actual impedance spectral components across a wide range of frequencies.

FIG. 13A, FIG. 13B, FIG. 14 and FIG. 15 are flowcharts of example methods to perform a battery impedance spectra measurement operation. The example methods can be performed by various components of battery monitoring system 202, such as controller circuit 220. In some examples, controller circuit 220 can fetch a set of instructions from a memory, and execute the instructions to perform the example methods. In some examples, controller circuit 220 can include hardware logic circuits configured to execute the example methods.

FIG. 13A is a flowchart of an example method 1300. In step 1302, controller circuit 220 can receive digital samples of a current signal that flow through a battery cell of a battery (e.g., battery cell 102 of battery 100) during a measurement period. The current signal can be a load current supplied by battery 100, or an external excitation current injected to and/or discharged from battery 100 by excitation source 226.

Controller circuit 220 may enable excitation source 226 to inject/discharge an external excitation current after generating an impedance spectrum based on the load current, and determining that the impedance spectrum does not include spectral components of sufficient power (e.g., based on comparing against a noise threshold) within a frequency range of interest. The current signal can be zero or non-zero outside the measurement period. The current signal can flow through a resistor to generate a voltage, and the resistor voltage can be sampled by an ADC of current measurement circuit 222 to generate digital samples of the current signal.

In step 1304, controller circuit 220 can receive digital samples of a voltage signal across the battery cell during the measurement period. The voltage signal can be output by the battery cell in response to the current signal. The voltage signal can be sampled by an ADC of voltage measurement circuit 224 to generate digital samples of the voltage signal.

Both the measurement period, as well as the sampling rate of the current signal and of the voltage signal, can be based on the range of frequency of interest. For example, the sample rate can be based on a Nyquist frequency, which can be twice of the maximum frequency of interest. For example, if the maximum frequency of interest is 10 kHz, the sampling frequency can be at least 20 kHz. Moreover, the duration of the measurement period can be based on the lowest frequency of interest. For example, if the spectral components of impedance spectrum to be measured has the lowest frequency of 1 kHz, the measurement period can span one or more periods of 1 kHz.

In step 1306, controller circuit 220 can generate first voltage spectral components based on performing a first transform operation on the digital samples of the voltage signal. In addition, in step 1308, controller circuit 220 can generate a current spectrum based on performing a second transform operation on the digital samples of the current signal.

Specifically, both the first transform operation and the second transform operation can include a transform operation that makes no assumption of the periodicity and initial and final conditions of the signals being transformed, such as Laplace transform, Z-transform, etc. Referring to FIG. 6 to FIG. 8 and Equations 16-33, controller circuit 220 can select a function, such as a piecewise linear interpolation function, a step function, a pulse function, etc., that can be used to approximate the variations of the current/voltage signals and that also has an analytical Laplace transform expression. Controller circuit 220 can combine the values of digital samples of the voltage signal with coefficients of the analytical Laplace transform expression for different s-domain parameters $s_k$ and compute the first voltage spectral components in step 1306. Moreover, controller circuit 220 can combine the values of digital samples of the voltage signal with coefficients of the analytical Laplace transform expression for different s-domain parameters $s_k$ and compute the current spectrum in step 1308.

In addition, controller circuit 220 can also compute a set of parameters that can be reused between the transform computations for the voltage signal and for the current signal, and store the parameters to avoid recomputing them again. For example, controller circuit 220 can compute an array of complex frequencies $s_k$ based on a set of frequencies $f_k$, as well as the exponents $e^{-s_k T_a}$ and $e^{-s_k T_{a+1}}$, to support the transform computations for the voltage signal in step 1306. Controller circuit 220 can then store these variables in the memory and reuse them for the transform computations for the current signal in step 1308.

In step 1310, controller circuit 220 can generate second voltage spectral components based on a first condition (e.g., an initial condition) of the battery before the measurement period and a second condition (e.g., a final condition) of the battery after the measurement period. The second voltage spectrum can be combined with the first voltage spectrum to generate a voltage response spectrum of a voltage response of the battery to the current signal, with the voltage response being compensated for an initial transient voltage (if any) prior to the measurement period and including a final transient voltage in response to the halting of the current signal after the measurement period ends.

Figure 13B:
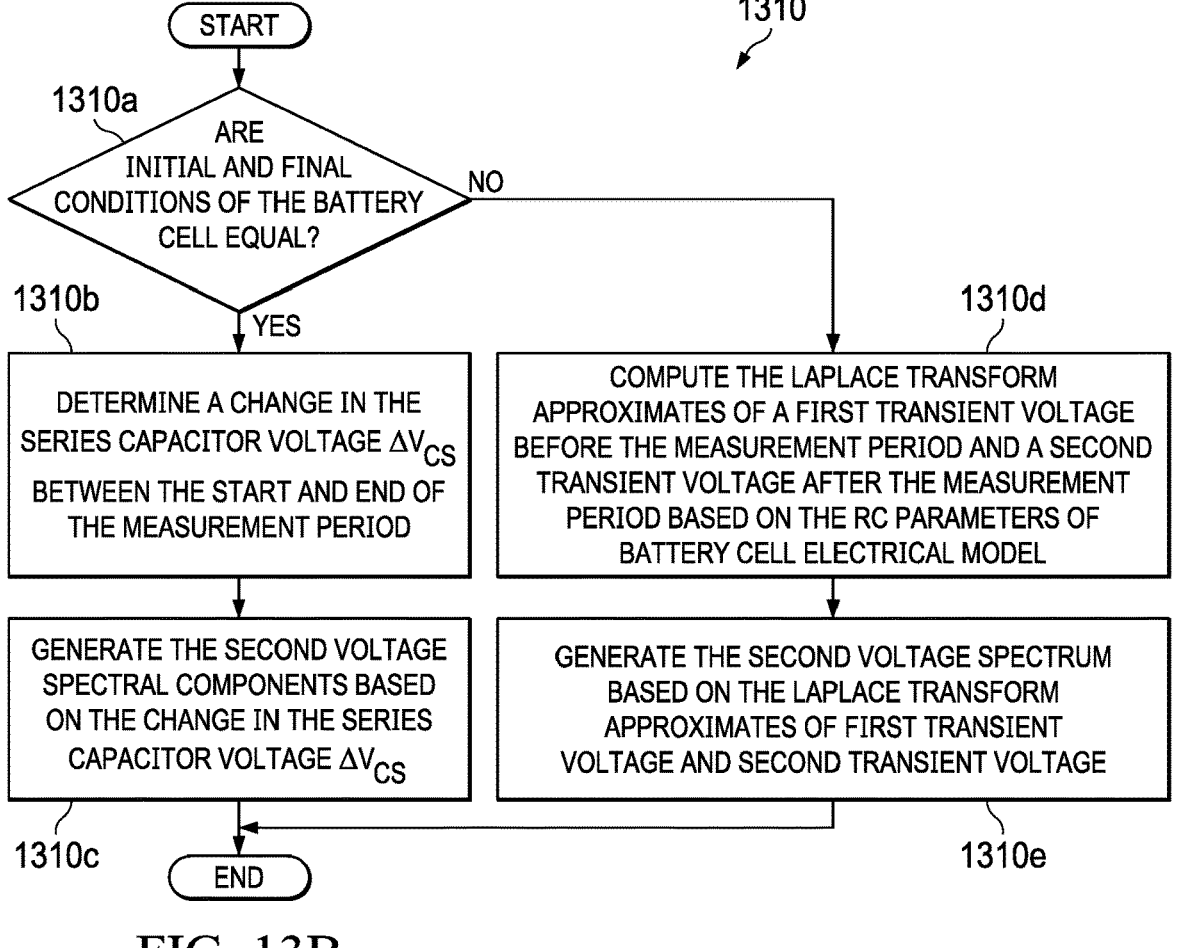

FIG. 13B illustrates a flowchart of operations that can be performed by controller circuit 220 as part of step 1310. Referring to FIG. 13B, in step 1310a, controller circuit 220 determines whether the initial condition and the final condition of the battery cell are equal. As described above in FIG. 9, the determination can be based on whether battery cell 102 (and battery 100) operates in a steady state condition, or whether battery 100 starts from a well relaxed state and ends also at a well relaxed state within the measurement period. For example, in a case where controller circuit 220 controls excitation source 226 to apply a periodic sinusoidal excitation current (by charging and/or discharging battery 100), controller circuit 220 can determine that battery cell 102 is in a steady state responsive to zero load current, and after multiple cycles of the periodic sinusoidal excitation current have been applied to the battery prior to the measurement period. As another example, controller circuit 220 can also determine that battery cell 102 starts from a well-relaxed state and ends also at a well-relaxed state if excitation source 226 applies a short pulse of excitation current to battery cell 102, and zero load current exists, and the measurement period includes a long relaxation period after the excitation current pulse ends.

If the initial and final conditions of the battery cell are equal (in step 1310a), the difference between the Laplace transform of the initial transient voltage $V_{init\_train}(s_k, [v_{init}])$ and the Laplace transform of the final transient voltage $Pexc(s_k, [v_{final}])$ can be simplified to a term based on the difference in the voltage across the series capacitor, $v_{Cs}$, between $t=0$ and $t=T_{meas}$, and the Laplace transform difference can be independent from the RC parameters of electrical model 110. Controller circuit 220 can determine a change in the series capacitor voltage $\Delta V_{Cs}$ between the start (e.g., $t=0$) and end of the measurement period (e.g., $t=T_{meas}$), in step 1310b. Controller circuit 220 can determine the changes in the series capacitor voltage $v_{Cs}$ based on various techniques including running a linear regression to determine a relationship between series capacitor voltage $v_{Cs}$ and measured voltage $v_{meas}(t)$ Controller circuit 220 can then generate the second voltage spectral components based on the change in the series capacitor voltage $\Delta V_{Cs}$ and Equation 34 described above, in step 1310c. Controller circuit 220 can generate the second voltage spectral components based on computing $\Delta V_{Cs}/s_k$ at different values of $s_k$ corresponding to different frequencies $f_k$. Step 1310 can then end.

If the initial and final conditions of the battery cell are not equal (in step 1310a), controller circuit 220 can compute the Laplace transform of a first transient voltage (e.g., an initial transient v voltage before the measurement period), $V_{init\_train}(s_k, [v_{init}])$, and the Laplace transform of a second transient voltage (e.g., a final transient voltage after the measurement period), $Pexc(s_k, [v_{final}])$, based on the RC parameters of battery electrical model 110, in step 1310d.

Specifically, controller circuit 220 can perform an optimization operation to determine the resistances $R_1$, $R_2$, $R_3$, and $R_S$, the capacitances of capacitors $C_1$, $C_2$, $C_3$, and $C_S$, as well as the internal voltage $v_{Rs}(t)$, $v_m(t)$ and $v_{Cs}(t)$, as described above in Equations 35-45. Controller circuit 220 can perform the optimization operation over an array of $s_k$ values each corresponding to a frequency $f_k$. The objective of the optimization operations can be based on minimizing a cost function r between the Laplace transform approximate of the voltage signal within the measurement period, $V_{meas,int}(s_k)$, and an initial estimate of the Laplace transform approximate of the voltage signal within the measurement period $V_{est}(s_k)$. As described above, Controller circuit 220 can compute $V_{meas,int}(s_k)$ from the voltage signal samples using the analytical Laplace transform expression of a function that approximates the variation of the voltage signal (e.g., a piecewise linear interpolation function, a step function, a pulse function, etc.) and can be used as a reference/target. Controller circuit 220 can also compute the estimate $V_{est}(s_k)$ based on initial estimate of the $R_m$ and $C_m$ parameters and the Laplace transform approximate of the current signal $I_{int}(s_k)$, based on Equations 35-39 described above. Controller circuit 220 can start the optimization operation with initial estimates of $R_m$ and $C_m$ parameters based on impedance $Z(s_k)$ of battery cell 102 in steady state, or initial estimates of $R_m$ and $C_m$ parameters based on the temperature and DOD of the battery cell (e.g., from table 1000 of FIG. 10). Controller circuit 220 can perform the optimization operation based on solving a Non-Linear Least-Squares (NLLS) problem, which can include computation of a residual fit error and an optimization cost function to obtain an optimal function over an array of $s_k$ values, based on Equations 40-46.

At the end of the optimization operation, controller circuit 220 can determine optimized functions $P_{init}*(s_k)$ and $P*exc(s_k)$ based on the optimal $R_m$ and $C_m$ parameters values, and controller circuit 220 can generate the second voltage spectrum based on computing the values of $P_{init}*(s_k)$ and $P*exc(s_k)$ over a set of $s_k$ values corresponding to frequencies $f_k$, in step 1310e. Step 1310 can then end.

Referring back to FIG. 13A, controller circuit 220 generates a voltage spectrum for the voltage signal including the first voltage spectral components and the second voltage spectral components, in step 1312. Controller circuit 220 can then generate an impedance spectrum of the battery cell based on the voltage response spectrum and the current spectrum, in step 1314. The impedance spectrum can be generated according to Equation 34, in the case of initial and final conditions of the battery cell being equal, or according to Equation 46, in the case of initial and final conditions of the battery cell not being equal.

Figure 14:
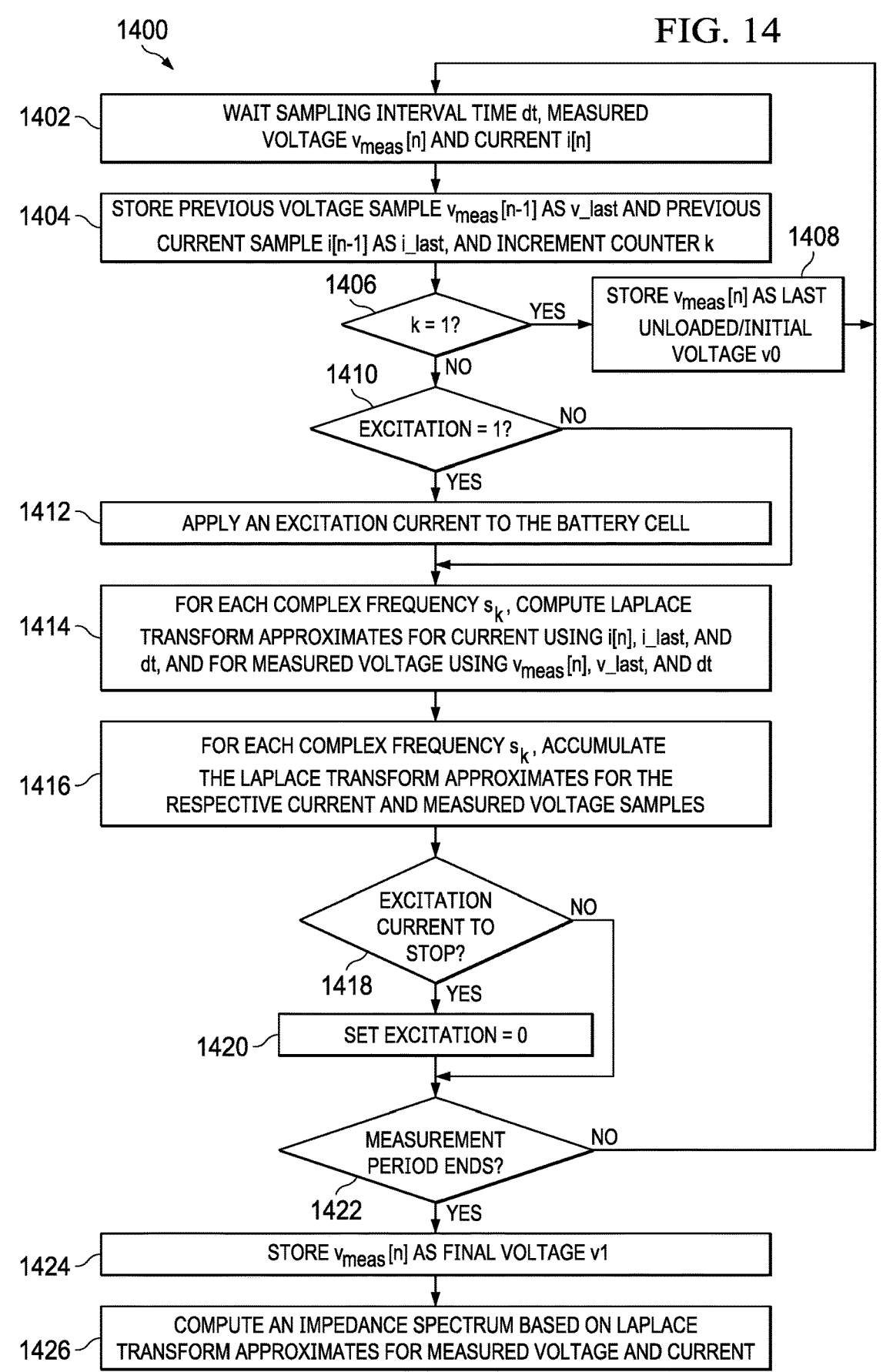

FIG. 14 illustrates a flowchart of an example method 1400 that can be performed by controller circuit 220 to perform impedance spectra measurements in a case where the initial and final conditions of battery cell 102 are equal. Method 1400 can include, for example, steps 1310b and 1310c of FIG. 13B.

Referring to FIG. 14, in step 1402, controller circuit 220 can wait for a sampling time interval dt, and then obtain a sample of a voltage signal across battery cell 102 as $v_{meas}[n]$ (e.g., using voltage measurement circuit 224) and obtain a sample of a current signal that flows through battery cell 102 as i[n] (e.g., using current measurement circuit 222). As described above, the sampling time interval can be based on a Nyquist sampling frequency, which in turn can be based on a maximum frequency of the spectral components of the voltage signal and of the current signal to be measured.

In step 1404, controller circuit 220 can store, in a memory, the previous voltage sample $v_{meas}[n-1]$ as a variable v_last and the previous current sample i[n−1] as a variable i_last, and increment a counter variable k. Counter variable k starts at zero. The counter variable k can be tracked by controller circuit 220 to determine whether the voltage sample are the last samples collected before an excitation current is applied to battery cell 102.

In step 1406, controller circuit 220 can determine whether the counter variable k equals one. If it is, controller circuit 220 can proceed to step 1408 and store $v_{meas}[n]$ as variable v0, which represents the last unloaded/initial voltage. In a case where no load current exists, and that battery cell 102 is in a well-relaxed state, v0 can be used to determine the initial voltage across series capacitor $C_S$, $v_{Cs}(0)$. Controller circuit 220 can then proceed to step 1402 to collect the next samples of voltage signal and current signal.

If the counter variable k does not equal one in step 1406, controller circuit 220 can determine whether an excitation variable equals one, in step 1410. The excitation variable can be initialized to one at the beginning, and can be set to zero when it is determined that the excitation current is to stop. If the excitation variable equals one, controller circuit 220 can control excitation source 226 to apply an excitation current, which can be a charging current, a discharging current (e.g., as shown in FIG. 2B), or both, to battery cell 102, in step 1412. But if the excitation current variable does not equal to one, controller circuit 220 can disable excitation source 226.

Controller circuit 220 can then proceed to step 1414, where it computes, for each complex frequency $s_k$, Laplace transform approximate for the interval dt for current using i[n], i_last (representing i[n−1]), and dt, and for voltage using $v_{meas}[n]$, v_last, and dt, based on Equations 16-33 as described above. Specifically, controller circuit 220 can select a function, such as a piecewise linear interpolation function, a step function, a pulse function, etc., that can be used to approximate the variations of the current/voltage signals and that also has an analytical Laplace transform expression. Controller circuit 220 can combine the i[n], i_last (for piecewise linear interpolation function), and dt with coefficients of the analytical Laplace transform expression to compute the Laplace transform approximate of the current signal. Moreover, controller circuit 220 can combine the $v_{meas}[n]$, v_last (for piecewise linear interpolation function), and dt with coefficients of the analytical Laplace transform expression to compute the Laplace transform approximate of the voltage signal.

In addition, controller circuit 220 can also compute a set of parameters that can be reused between the transform computations for the voltage signal and for the current signal, and store the parameters to avoid recomputing them again. For example, controller circuit 220 can compute an array of complex frequencies $s_k$ based on a set of frequencies $f_k$, as well as the exponents $e^{-s_k T_a}$ and $e^{-s_k T_{a+1}}$, to support the transform computations for the voltage signal. Controller circuit 220 can then store these variables and reuse them for the transform computations for the current signal.

In step 1416, for each complex frequency $s_k$, controller circuit 220 can accumulate the Laplace transform approximates of the respective current and voltage signals samples. For example, controller circuit 220 can add the Laplace transform approximate of the current signal sample i[n] to the sum of Laplace transform approximates of the previous current signal samples to compute a current spectral component. Controller circuit 220 can also add the Laplace transform approximate of the measured voltage signal sample $v_{meas}[n]$ to the sum of Laplace transform approximates of the previous measured voltage signal samples to compute the first voltage spectral components.

In step 1418, controller circuit 220 can determine whether the application of excitation current is to stop. Referring back to FIG. 9, the determination can be based on, for example, whether the measurement period $T_{meas}$ has expired, as in operation condition 902, or whether the stop time $T_{stop}$ has arrived, as in operation condition 904. If controller circuit 220 determines that application of excitation current is to stop, it can proceed to step 1420 to set the excitation variable to zero.

In step 1422, controller circuit 220 can determine whether the measurement period $T_{meas}$ has ended. Referring back to FIG. 9, in operation condition 902, the measurement period $T_{meas}$ can stop at the end of the last cycle of excitation current, whereas in operation condition 904, the measurement period can stop at the end of the relaxation period. If controller circuit 220 determines that the measurement period $T_{meas}$ has not yet ended, it can proceed back to step 1402 to collect the next samples of current signal and measured voltage signal.

If controller circuit 220 determines that the measurement period $T_{meas}$ has ended in step 1522, it can proceed to step 1424 to store the voltage sample $v_{meas}[n]$ as the final voltage v1. The final voltage can represent the final voltage across series capacitor $C_S$, $v_{Cs}(T_{meas})$. Controller circuit 220 can then proceed to step 1426 to compute the voltage spectrum of battery cell 102 based on the first voltage spectral components computed in steps 1414 and 1416, second voltage spectral components based on the initial voltage v0 and final voltage v1, and the current spectrum computed in steps 1414 and 1416, as described above with respect to Equation 34.

FIG. 15 illustrates a flowchart of an example method 1500 that can be performed by controller circuit 220 to perform impedance spectra measurements in a case where the initial and final conditions of battery cell 102 do not match. Method 1500 can include, for example, steps 1310*d* and 1310*e* of FIG. 13B.

Referring to FIG. 15, in step 1502, controller circuit 220 can wait for a sampling time interval dt, and then obtain a sample of a voltage signal across battery cell 102 as $v_{meas}[n]$ (e.g., using voltage measurement circuit 224) and obtain a sample of a current signal that flows through battery cell 102 as i[n] (e.g., using current measurement circuit 222). Controller circuit 220 can also measure temperature T using temperature sensor 228. As described above, the sampling time interval can be based on a Nyquist sampling frequency, which in turn can be based on a maximum frequency of the spectral components of the voltage signal and of the current signal to be measured.

In step 1504, controller circuit 220 can store the previous voltage sample $v_{meas}[n−1]$ as a variable v_last and the previous current sample i[n−1] as a variable i_last, and increment a counter variable k. Counter variable k starts at zero. The counter variable k can be tracked by controller circuit 220 to determine whether the voltage sample are the last samples collected before an excitation current or load current is applied to battery cell 102. The depth of discharge DOD can be determined based on the sampled voltage prior to flowing of current through battery cell 102.

In step 1506, controller circuit 220 can determine whether the counter variable k equals one. If it is, controller circuit 220 can proceed to step 1508 and determine the current depth of discharge, $DOD_{present}$, based on the measured voltage sample $v_{meas}[n]$ and temperature T. $DOD_{present}$ can be determined based on solving a function that relates OCV with DODs, as well as temperature T, obtained from a discharge/relaxation test such as the one shown in FIG. 10. $DOD_{present}$ can also be updated for each current sample based on Equations 48 and 49. Controller circuit 220 can then proceed back to step 1502 to collect next current and voltage samples.

If the counter variable k does not equal to one in step 1506, controller circuit 220 may determine that the voltage and current samples are obtained within the measurement period $T_{meas}$, where the measured voltage is a voltage response signal of battery cell 102 to the current signal. Controller circuit 220 can then proceed to step 1510, for each complex frequency $s_k$, Laplace transform approximate for the interval dt for current using i[n], i_last (representing i[n−1]), and dt, and for voltage using $v_{meas}$[n], v_last, and dt, based on Equations 16-33 as described above. Specifically, controller circuit 220 can select a function, such as a piecewise linear interpolation function, a step function, a pulse function, etc., that can be used to approximate the variations of the current/voltage signals and that also has an analytical Laplace transform expression. Controller circuit 220 can combine the i[n], i_last (for piecewise linear interpolation function), and dt with coefficients of the analytical Laplace transform expression to compute the Laplace transform approximate of the current signal. Moreover, controller circuit 220 can combine the $v_{meas}$[n], v_last (for piecewise linear interpolation function), and dt with coefficients of the analytical Laplace transform expression to compute the Laplace transform approximate of the voltage signal.

In addition, controller circuit 220 can also compute a set of parameters that can be reused between the transform computations for the voltage signal and for the current signal, and store the parameters to avoid recomputing them again. For example, controller circuit 220 can compute an array of complex frequencies $s_k$ based on a set of frequencies $f_k$, as well as the exponents $e^{-s_k T_a}$ and $e^{-s_k T_{a+1}}$, to support the transform computations for the voltage signal. Controller circuit 220 can then store these variables and reuse them for the transform computations for the current signal.

In step 1512, for each complex frequency $s_k$, controller circuit 220 can accumulate the Laplace transform approximates of the respective current and voltage signals samples. For example, controller circuit 220 can add the Laplace transform approximate of the current signal sample i[n] to the sum of Laplace transform approximates of the previous current signal samples to compute a current spectral component. Controller circuit 220 can also add the Laplace transform approximate of the measured voltage signal sample $v_{meas}$[n] to the sum of Laplace transform approximates of the previous measured voltage signal samples to compute the first voltage spectral components.

In step 1514, controller circuit 220 can determine whether the measurement period $T_{meas}$ has ended. If it has not, controller circuit 220 can proceed back to step 1602 to obtain the next current and voltage samples to update the Laplace transform approximates of the voltage and current signals.

If the measurement period $T_{meas}$ has ended in step 1514, controller circuit 220 can proceed to select initial estimate $R_s$, $C_{ser}$, $R_m$, $C_m$, and internal voltages $v_m$ from a DOD table (e.g., table 1000 of FIG. 10 based on $DOD_{present}$ and temperature T), in step 1516.

As part of step 1516, controller circuit 220 can also update the estimates to minimize cost function r(s). Specifically, controller circuit 220 can perform an optimization operation to determine the resistances $R_m$ (e.g., $R_1$, $R_2$, $R_3$, and $R_S$ of FIG. 1B) the capacitances $C_m$ (e.g., capacitances of capacitors $C_1$, $C_2$, $C_3$, and $C_S$ of FIG. 1B), as well as the internal voltage $v_{Rs}$(t), $v_m$(t) and $v_{Cs}$(t). Controller circuit 220 can perform the optimization operation over an array of $s_k$ values each corresponding to a frequency $f_k$. The objective of the optimization operations can be based on minimizing a cost function r between a target Laplace transform approximate of the measured voltages $V_{meas,int}$($s_k$) and an initial estimate of Laplace transform of the measured voltage $V_{est}$($s_k$). Controller circuit 220 can compute the initial estimate based on estimated $R_m$ and $C_m$ parameters and the Laplace transform approximate of the current signal $I_{int}$($s_k$), based on Equations 35-39 above. Controller circuit 220 can start the optimization operation with initial estimates of $R_m$ and $C_m$ parameters based on impedance Z($s_k$) of battery cell 102 in steady state, or initial estimates of initial estimates of $R_m$ and $C_m$ parameters based on the temperature and DOD of the battery cell (e.g., from table 1000 of FIG. 10). The optimization can be based on solving a Non-Linear Least-Squares (NLLS) problem, which can include computation of a residual fit error and an optimization cost function to obtain an optimal function over an array of $s_k$ values, based on Equations 40-45.

At the end of the optimization operation, controller circuit 220 can determine the optimized functions $P_{init}$*($s_k$) and P* exc($s_k$) based on the optimal parameter values. Controller circuit 220 can compute the Laplace transform approximate of the initial transient voltage, Vinit($s_k$), based on $P_{init}$*($s_k$), and the Laplace transform approximate of the final transient voltage, Pexec($s_k$), based on P*exc($s_k$), over a set of $s_k$ values corresponding to frequencies $f_k$, in step 1518.

In step 1520, controller circuit 220 can compute an impedance spectrum Z of battery cell 102 based on the Laplace transform approximates of the voltage and current signal samples within the measurement period (from steps 1510 and 1512), as well as Vinit($s_k$), and Pexec($s_k$), as described above with respect to Equation 46.

In step 1522, controller circuit 220 can update the $R_s$, $C_{ser}$, $R_m$, $C_m$, and internal voltages $v_m$ estimates in DOD table using the updated estimates from the optimization operation. The combination can be based on, for example, a linear interpolation operation, a weighted averaging operation, etc.

Any of the computing systems mentioned herein may utilize any suitable number of subsystems. Examples of such subsystems are shown in FIG. 16 in a hardware computing system 10, which can be part of battery monitoring system 202.

Figure 16:
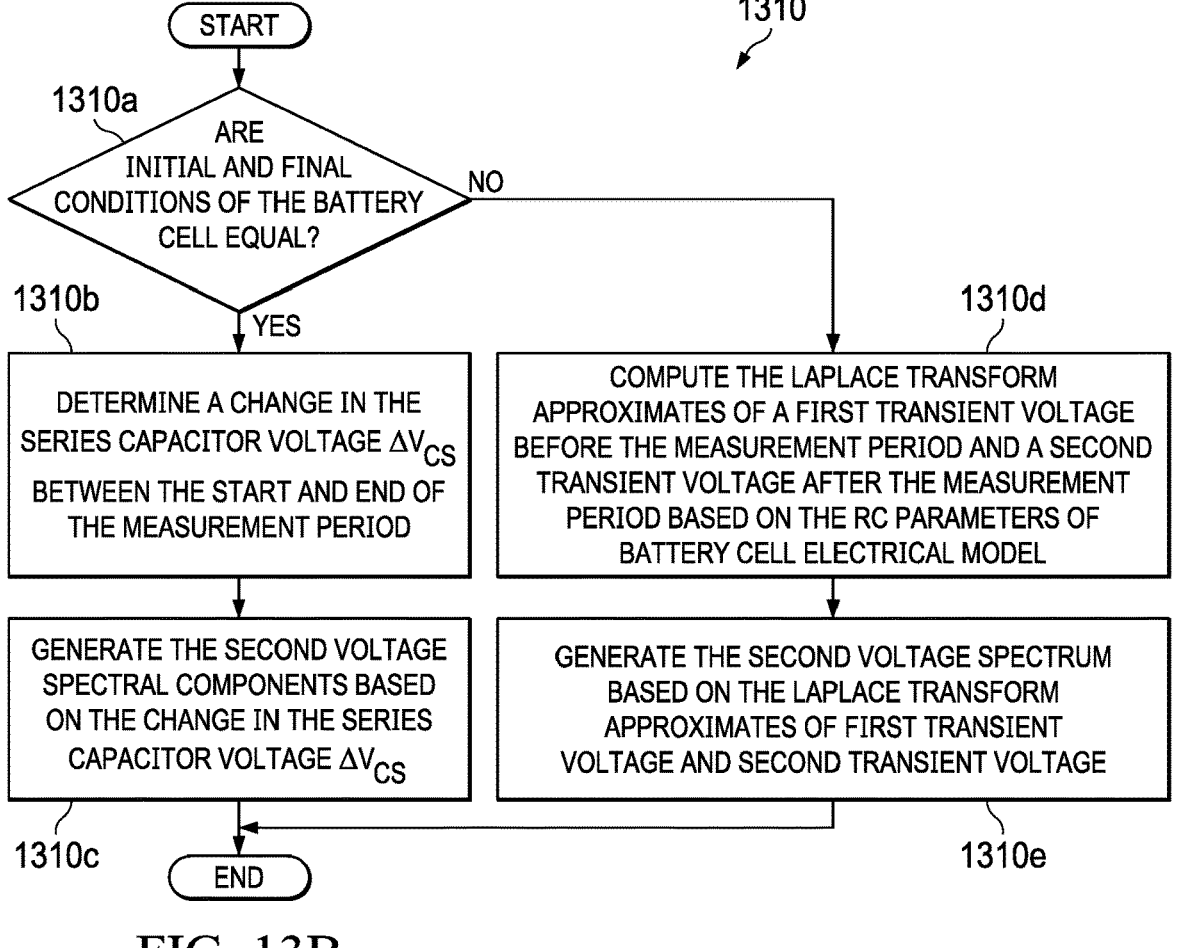
FIG. 16 illustrates an example hardware computing system that can implement techniques of example embodiments.

The subsystems shown in FIG. 16 are interconnected via a system bus 75. Additional subsystems such as a printer 74, keyboard 78, storage device(s) 79, monitor 76 (which is coupled to display adapter 82) and others are shown. Peripherals and input/output (I/O) devices, which couple to I/O controller 71, can be connected to the hardware computing system by any number of means such as input/output (I/O) port 77 (e.g., USB, FireWire®). For example, I/O port 77 or external interface 81 (e.g. Ethernet, Wi-Fi, etc.) can be used to connect hardware computing system 10 to a wide area network such as the Internet, a mouse input device, or a scanner. The interconnection via system bus 75 allows the central processor 73 to communicate with each subsystem and to control the execution of a plurality of instructions from system memory 72 or the storage device(s) 79 (e.g., a fixed disk, such as a hard drive, or optical disk), and the exchange of information between subsystems. The system memory 72 and/or the storage device(s) 79 may embody a computer readable medium. In some examples, central processor 73 can be part of controller circuit 220, which can execute instructions stored in system memory 72 and/or storage device(s) 79 to perform the example computations and methods described above in, for example, FIG. 13A through FIG. 15, and use system memory 72 to store the input data, output data, as well as intermediary data generated from the performance of the methods. Another subsystem is a data collection device 85, such as current measurement circuit 222, voltage measurement circuit 224, and temperature sensor 228 of FIG. 2A. Data collection device 85 can store the data (e.g., samples of current signal and voltage signal, temperature measurements, etc.) at system memory 72. Any of the data described herein can be output from one component to another component and can be provided to the user.

A hardware computing system can include the same components or subsystems, e.g., connected together by external interface 81 or by an internal interface. In some embodiments, hardware computing systems, subsystem, or apparatus can communicate over a network. In such instances, one computer can be a client and another computer a server, where each can be part of a same computer system. A client and a server can each include multiple systems, subsystems, or components.

Aspects of embodiments herein can be implemented in the form of control logic using hardware (e.g. an application specific integrated circuit or field programmable gate array) and/or using computer software with a generally programmable processor in a modular or integrated manner. As used herein, a processor includes a single-core processor, multicore processor on a same integrated chip, or multiple processing units on a single circuit board or networked.

Any of the software components or functions described in this application may be implemented as software code to be executed by a processor using any suitable computer language such as, for example, Java, C, C++, C #, Objective-C, Swift, or scripting language such as Perl or Python using, for example, conventional or object-oriented techniques. The software code may be stored as a series of instructions or commands on a computer readable medium for storage and/or transmission. A suitable non-transitory computer readable medium can include random access memory (RAM), a read only memory (ROM), a magnetic medium such as a hard-drive or a floppy disk, or an optical medium such as a compact disk (CD) or DVD (digital versatile disk), flash memory, and the like. The computer readable medium may be any combination of such storage or transmission devices.

Such programs may also be encoded and transmitted using carrier signals adapted for transmission via wired, optical, and/or wireless networks conforming to a variety of protocols, including the Internet. As such, a computer readable medium may be created using a data signal encoded with such programs. Computer readable media encoded with the program code may be packaged with a compatible device or provided separately from other devices (e.g., via Internet download). Any such computer readable medium may reside on or within a single computer product (e.g. a hard drive, a CD, or an entire computing system), and may be present on or within different computer products within a system or network. A computing system may include a monitor, printer, or other suitable display for providing any of the results mentioned herein to a user.

Any of the methods described herein may be totally or partially performed with a computing system including one or more processors, which can be configured to perform the steps. Thus, embodiments can be directed to computing systems configured to perform the steps of any of the methods described herein, potentially with different components performing a respective steps or a respective group of steps. Although presented as numbered steps, steps of methods herein can be performed at a same time or in a different order. Additionally, portions of these steps may be used with portions of other steps from other methods. Also, all or portions of a step may be optional. Additionally, any of the steps of any of the methods can be performed with modules, units, circuits, or other means for performing these steps.

In this description, the term "couple" may cover connections, communications or signal paths that enable a functional relationship consistent with this description. For example, if device A provides a signal to control device B to perform an action, then: (a) in a first example, device A is directly coupled to device B; or (b) in a second example, device A is indirectly coupled to device B through intervening component C if intervening component C does not substantially alter the functional relationship between device A and device B, so device B is controlled by device A via the control signal provided by device A.

A device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

A circuit or device that is described herein as including certain components may instead be adapted to be coupled to those components to form the described circuitry or device. For example, a structure described herein as including one or more semiconductor elements (such as transistors), one or more passive elements (such as resistors, capacitors and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, such as by an end-user and/or a third party.

While certain components may be described herein as being of a particular process technology, these components may be exchanged for components of other process technologies. Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in series or in parallel between the same two nodes as the single resistor or capacitor.

Uses of the phrase "ground voltage potential" in this description include a chassis ground, an Earth ground, a floating ground, a virtual ground, a digital ground, a common ground, and/or any other form of ground connection applicable to, or suitable for, the teachings of this description. Unless otherwise stated, "about," "approximately," or "substantially" preceding a value means +/−10 percent of the stated value.

Modifications are possible in the described examples, and other examples are possible, within the scope of the claims.

What is claimed is:

1. An apparatus comprising:
a controller circuit having control inputs and control outputs, the controller circuit configurable to:
    receive, via the control inputs, a first signal representing an electrical quantity of a device under test (DUT) within a period;
    generate spectral components of the electrical quantity responsive to the first signal, and a matching condition between a first condition when the period starts and a second condition when the period ends;
    generate a spectrum of the electrical quantity including the spectral components; and
    provide a second signal at the control outputs responsive to generating the spectrum.

2. The apparatus of claim 1, wherein the spectral components are first spectral components, and the controller circuit is configurable to:
perform a transform operation determined based on whether the first condition is different from the second condition;
generate second spectral components of the electrical quantity responsive to performing the transform operation on the first signal; and
generate the spectrum including the first and second spectral components.

3. The apparatus of claim 2, wherein the electrical quantity is a first electrical quantity, the transform operation is a first transform operation, the spectrum is a first spectrum, and the controller circuit is configurable to:
receive a third signal representing a second electrical quantity of the DUT within the period;
perform a second transform operation determined based on whether a third condition when the period starts is different from a fourth condition when the period ends;
generate a second spectrum of the second electrical quantity responsive to a result of the second transform operation on the third signal;
generate a measurement of a physical property of the DUT responsive to generating the first spectrum and the second spectrum; and
provide the second signal representing the measurement at the control outputs.

4. The apparatus of claim 3, wherein the controller circuit is configurable to:
perform Fourier transform operations as part of the first transform operation and the second transform operation responsive to the first and second conditions matching and the third and fourth conditions matching; and
perform Laplace transform operations or Z-transform operations as part of the first transform operation and the second transform operation responsive to the first and second conditions being different and the third and fourth conditions being different.

5. The apparatus of claim 4, wherein the controller circuit is configurable to:
receive first parameters of a first Laplace transform expression of a first function that approximates variations of the first electrical quantity within the period;
receive second parameters of a second Laplace transform expression of a second function that approximates variations of the second electrical quantity within the period;
generate the first spectrum responsive to receiving the first signal and the first parameters; and generate the second spectrum responsive to receiving the third signal and the second parameters.

6. The apparatus of claim 2, wherein the controller circuit is configurable to:
responsive to the first condition matching the second condition:
    determine a difference between a first value of the electrical quantity of the DUT before the period and a second value of the electrical quantity of the DUT after the period; and
    generate the second spectral components responsive to computing a Laplace transform of the difference.

7. The apparatus of claim 6, wherein each of the first and second values includes an open circuit voltage (OCV) of the DUT.

8. The apparatus of claim 2, wherein the controller circuit is configurable to:
responsive to the first condition not matching the second condition:
    determine a first Laplace transform responsive to the first condition;
    determine a second Laplace transform responsive to the second condition; and
    generate the second spectral components responsive to determining the first Laplace transform and the second Laplace transform.

9. The apparatus of claim 3, further comprising an excitation source.

10. The apparatus of claim 9, wherein:
the excitation source has an excitation control input, a positive terminal, and a negative terminal, and the excitation source includes a switchable discharge path coupled between the positive and negative terminals;
the controller circuit has an excitation control output coupled to the excitation control input, and the controller circuit is configurable to enable the discharge path; and
the third signal represents a discharge current that flows out of the DUT between the positive and negative terminals.

11. The apparatus of claim 10, wherein the excitation source comprises a current source coupled to the positive terminal and configurable to provide a charging current at the positive terminal; and
wherein the third signal represents the charging current.

12. The apparatus of claim 10, wherein the excitation source comprises a voltage source;
wherein the excitation source is configurable to apply a voltage across the DUT to generate a current; and
wherein the first electrical quantity is the voltage and the second electrical quantity is the current.

13. The apparatus of claim 9, wherein the first electrical quantity is a voltage is provided by the DUT in response to a current supplied by the excitation source, and the current is the second electrical quantity.

14. The apparatus of claim 3, wherein the second electrical quantity is periodic at least within the period.

15. A method comprising:
receiving, from a sense circuit, a first signal representing an electrical quantity of a device under test (DUT) within a period;
generating, by a controller circuit, spectral components of the electrical quantity responsive to the first signal, and a matching condition between a first condition when the period starts and a second condition when the period ends;

generating, by the controller circuit, a spectrum of the electrical quantity including the spectral components; and providing, by the controller circuit, a second signal responsive to generating the spectrum.

16. The method of claim 15, wherein the spectral components are first spectral components, and the method further comprises:

performing, by the controller circuit, a transform operation selected based on whether the first condition is different from the second condition;

generating, by the controller circuit, second spectral components of the electrical quantity responsive to performing the transform operation on the first signal; and generating, by the controller circuit, the spectrum including the first and second spectral components.

17. The method of claim 16, wherein the transformation operation is a first transformation operation, the sense circuit is a first sense circuit, the electrical quantity is a first electrical quantity, the spectrum is a first spectrum, and the method further comprises:

receiving, from a second sense circuit, a third signal representing a second electrical quantity of the DUT within the period;

performing, by the controller circuit, a second transform operation selected based on whether a third condition when the period starts is different from a fourth condition when the period ends;

generating, by the controller circuit, a second spectrum of the second electrical quantity responsive to performing the second transform operation on the third signal;

generating, by the controller circuit, a measurement of a physical property of the DUT responsive generating the first spectrum and the second spectrum; and providing, by the controller circuit, the second signal representing the measurement.

18. The method of claim 17, further comprising:

performing Fourier transform operations as part of the first transform operation and the second transform operation responsive to the first and second conditions matching and the third and fourth conditions matching; and performing Laplace transform operations or Z-transform operations as part of the first transform operation and the second transform operation responsive to the first and second conditions being different and the third and fourth conditions being different.

19. A non-transitory computer readable medium storing instructions that, when executed by a processor, cause the processor to:

receive, from a sense circuit, a first signal representing an electrical quantity of a device under test (DUT) within a period;

generate spectral components of the electrical quantity responsive to the first signal, and a matching condition between a first condition when the period starts and a second condition when the period ends;

generate a spectrum of the electrical quantity including the spectral components; and provide a second signal responsive to generating the spectrum.

20. The non-transitory computer readable medium of claim 19, wherein the spectral components are first spectral components, and the non-transitory computer readable medium further stores instructions that, when executed by the processor, cause the processor to:

perform a transform operation selected based on whether the first condition is different from the second condition;

generate second spectral components responsive to performing the transform operation on the first signal; and generate the spectrum including the first and second spectral components.

21. The non-transitory computer readable medium of claim 20, wherein the transform operation is a first transform operation, the sense circuit is a first sense circuit, the electrical quantity is a first electrical quantity, the spectrum is a first spectrum, and the non-transitory computer readable medium further stores instructions that, when executed by the processor, cause the processor to:

receive a third signal representing a second electrical quantity of the DUT within the period;

perform a second transform operation determined based on whether a third condition when the period starts is different from a fourth condition when the period ends;

generate a second spectrum of the second electrical quantity responsive to performing the second transform operation on the third signal; and generate a measurement of a physical property of the DUT responsive to generating the first spectrum and the second spectrum.

22. The non-transitory computer readable medium of claim 21, wherein the non-transitory computer readable medium further stores instructions that, when executed by the processor, cause the processor to:

perform Fourier transform operations as part of the first transform operation and the second transform operation responsive to the first and second conditions matching and the third and fourth conditions matching; and perform Laplace transform operations or Z-transform operations as part of the first transform operation and the second transform operation responsive to the first and second conditions being different and the third and fourth conditions being different.

23. The non-transitory computer readable medium of claim 21, wherein the first electrical quantity is a voltage, the second electrical quantity is a current, the physical property is an impedance, and the measurement is a spectroscopy of the impedance.

24. The apparatus of claim 3, wherein the first electrical quantity is a voltage, the second electrical quantity is a current, the physical property is an impedance, and the measurement is a spectroscopy of the impedance.

25. The method of claim 17, wherein the first electrical quantity is a voltage, the second electrical quantity is a current, the physical property is an impedance, and the measurement is a spectroscopy of the impedance.

26. The apparatus of claim 1, further comprising a sensor circuit coupled to the controller circuit, the sensor circuit configurable to sense the electrical quantity and generate the first signal representing a result of the sensing.

27. The apparatus of claim 1, wherein the DUT includes an electrochemical cell.

28. The apparatus of claim 1, wherein the first condition is a first condition of the first signal and the second condition is a second condition of the first signal.

29. The apparatus of claim 28, wherein the first condition and the second condition of the first signal indicate whether the first signal is periodic within the period.

30. The apparatus of claim 1, wherein the first condition is a first condition of the DUT and the second condition is a second condition of the DUT.

31. The apparatus of claim 30, wherein the first condition and the second condition of the DUT indicate whether the DUT is in a steady state within the period.

32. The method of claim 15, wherein the DUT includes an electrochemical cell.

33. The method of claim 15, wherein the first condition is a first condition of the first signal and the second condition is a second condition of the first signal.

34. The method of claim 33, wherein the first condition and the second condition of the first signal indicate whether the first signal is periodic within the period.

35. The method of claim 15, wherein the first condition is a first condition of the DUT and the second condition is a second condition of the DUT.

36. The method of claim 35, wherein the first condition and the second condition of the DUT indicate whether the DUT is in a steady state within the period.

37. The non-transitory computer readable medium of claim 19, wherein the DUT includes an electrochemical cell.

38. The non-transitory computer readable medium of claim 19, wherein the first condition is a first condition of the first signal and the second condition is a second condition of the first signal.

39. The non-transitory computer readable medium of claim 38, wherein the first condition and the second condition of the first signal indicate whether the first signal is periodic within the period.

40. The non-transitory computer readable medium of claim 19, wherein the first condition is a first condition of the DUT and the second condition is a second condition of the DUT.

41. The non-transitory computer readable medium of claim 40, wherein the first condition and the second condition of the DUT indicate whether the DUT is in a steady state within the period.

* * * * *